(12) United States Patent
Kaneko et al.

(10) Patent No.: US 10,342,091 B2
(45) Date of Patent: Jul. 2, 2019

(54) LIGHT-EMITTING DEVICE

(71) Applicant: Sharp Kabushiki Kaisha, Sakai, Osaka (JP)

(72) Inventors: Kazuaki Kaneko, Sakai (JP); Makoto Matsuda, Sakai (JP); Hiroaki Onuma, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/555,415

(22) PCT Filed: Nov. 17, 2015

(86) PCT No.: PCT/JP2015/082242
§ 371 (c)(1),
(2) Date: Sep. 1, 2017

(87) PCT Pub. No.: WO2016/147484
PCT Pub. Date: Sep. 22, 2016

(65) Prior Publication Data
US 2018/0042081 A1 Feb. 8, 2018

(30) Foreign Application Priority Data

Mar. 13, 2015 (JP) .................. 2015-050927

(51) Int. Cl.
*H05B 33/08* (2006.01)
*H01L 33/50* (2010.01)
(Continued)

(52) U.S. Cl.
CPC ..... *H05B 33/0857* (2013.01); *H01L 25/0753* (2013.01); *H01L 33/50* (2013.01);
(Continued)

(58) Field of Classification Search
CPC combination set(s) only.
See application file for complete search history.

(56) References Cited

U.S. PATENT DOCUMENTS 10,084,119 B2 * 9/2018 Onuma ................ C09K 11/646
2011/0050071 A1   3/2011 Chung et al.
(Continued)

FOREIGN PATENT DOCUMENTS

CN 203788515 U 8/2014
JP 2004-111104 A 4/2004
(Continued)

*Primary Examiner* — Douglas W Owens
*Assistant Examiner* — Jianzi Chen
(74) *Attorney, Agent, or Firm* — Birch, Stewart, Kolasch & Birch, LLP

(57) ABSTRACT

Provided is a light-emitting device that is able to adjust a color temperature by power supplied from a single power source. The light-emitting device includes an anode electrode land, a cathode electrode land, and three or more wires that are provided in parallel and are connected to the anode electrode land and the cathode electrode land, in which at least three wires among the three or more wires have different forward current-forward voltage characteristics and are connected to different light emitting portions, and the color temperature of light emitted from the whole of the light-emitting portions is able to be adjusted.

5 Claims, 27 Drawing Sheets

(51) Int. Cl.
  *H01L 25/075* (2006.01)
  *H05B 37/02* (2006.01)
  *H01L 33/62* (2010.01)

(52) U.S. Cl.
  CPC ..... *H05B 33/0803* (2013.01); *H05B 33/0827* (2013.01); *H05B 37/02* (2013.01); *H01L 33/62* (2013.01); *H01L 2224/48137* (2013.01)

(56) References Cited

U.S. PATENT DOCUMENTS

| | | | |
|---|---|---|---|
| 2011/0180817 A1* | 7/2011 | Ishizaki | F21V 3/00 257/88 |
| 2011/0278606 A1 | 11/2011 | Suzuki et al. | |
| 2012/0044669 A1 | 2/2012 | Ogata et al. | |
| 2012/0098460 A1 | 4/2012 | Miyasaka et al. | |
| 2012/0193657 A1 | 8/2012 | von Malm et al. | |
| 2013/0257266 A1 | 10/2013 | Ishizaki | |
| 2014/0168965 A1 | 6/2014 | Moon et al. | |
| 2015/0008835 A1 | 1/2015 | Sugiura et al. | |
| 2015/0016088 A1 | 1/2015 | Shiraichi et al. | |
| 2015/0102744 A1* | 4/2015 | Muto | G03B 15/05 315/228 |
| 2015/0264756 A1 | 9/2015 | Xu | |
| 2016/0149095 A1 | 5/2016 | Onuma et al. | |

FOREIGN PATENT DOCUMENTS

| | | |
|---|---|---|
| JP | 4081665 B2 | 4/2008 |
| JP | 2008-218486 A | 9/2008 |
| JP | 2015-35598 A | 2/2010 |
| JP | 2011-49516 A | 3/2011 |
| JP | 2012-124356 A | 6/2012 |
| JP | 2012-129542 A | 7/2012 |
| JP | 2012-221755 A | 11/2012 |
| JP | 2013-502062 A | 1/2013 |
| JP | 2013-171684 A | 9/2013 |
| JP | 2013231865 A | 11/2013 |
| JP | 2014-194858 A | 10/2014 |
| JP | 2015-80684 A | 3/2015 |
| WO | WO 2010/090289 A1 | 8/2010 |
| WO | WO 2011/004796 A1 | 1/2011 |
| WO | WO 2014/103671 A1 | 7/2014 |
| WO | WO 2014/203841 A1 | 12/2014 |

* cited by examiner

LIGHT-EMITTING DEVICE

TECHNICAL FIELD

The present invention relates to a light-emitting device that is able to adjust color temperature.

BACKGROUND ART

A halogen lamp is very approximate in energy distribution to a full radiator and therefore exhibits excellent color rending properties. Furthermore, a color temperature of light emitted from the halogen lamp is able to be changed in accordance with a magnitude of power supplied to the halogen lamp and thus the halogen lamp is used as a visible light source. However, since the halogen lamp emits infrared rays, there are problems, for example, that the halogen lamp becomes extremely high in temperature, needs a reflector to prevent infrared radiation, has a shorter operating time than an LED, and requires large power consumption. Then, a white light-emitting device that uses a light-emitting diode (LED) which generates less heat and has a longer operating time has been developed.

PTL 1 (Japanese Unexamined Patent Application Publication No. 2014-194858) describes an inexpensive and useful LED lighting device that includes a semiconductor light-emitting device having three or more different color temperatures, in which a color temperature is controlled in a relatively wide range and a natural change in the color temperature is achieved along a blackbody radiation, and desired chromaticity adjustment is allowed by a simple method without requiring complicated control.

CITATION LIST

Patent Literature

PTL 1: Japanese Unexamined Patent Application Publication No. 2014-194858

SUMMARY OF INVENTION

Technical Problem

In a technique of the PTL 1, a switching circuit and a light emitter control circuit are constituted together, and thus the constitution is complicated and incurs costs.

The invention is made to solve the above-mentioned problems and an object thereof is to provide a light-emitting device that is able to adjust a color temperature by power supplied from a single power source.

Solution to Problem

[1] A light-emitting device of the invention includes an anode electrode land, a cathode electrode land, and three or more wires that are provided in parallel and are connected to the anode land and the cathode electrode land, in which at least three wires among the three or more wires have different forward current-forward voltage characteristics and are connected to different light-emitting portions, and a color temperature of light emitted from a whole of the light-emitting portions is able to be adjusted.

[2] In the light-emitting device of the invention, it is preferable that each of the light-emitting portions connected to corresponding one of the three or more wires is arranged such that light emitted from any of the light-emitting portions is able to be mixed with light emitted from the rest of the light-emitting portions.

[3] In the light-emitting device of the invention, it is preferable that each of the light-emitting portions includes at least two kinds of phosphors, and contents of the phosphors included in the light-emitting portions are all different from each other.

[4] In the light-emitting device of the invention, it is preferable that one or more light-emitting portions are connected in series to each of the three or more wires.

[5] It is preferable that the light-emitting device of the invention further includes a resin dam provided surrounding the whole of the light-emitting portions.

Advantageous Effects of Invention

According to the invention, a light-emitting device that is able to adjust a color temperature by power supplied from a single power source is able to be provided.

DESCRIPTION OF EMBODIMENTS

Figure 1:
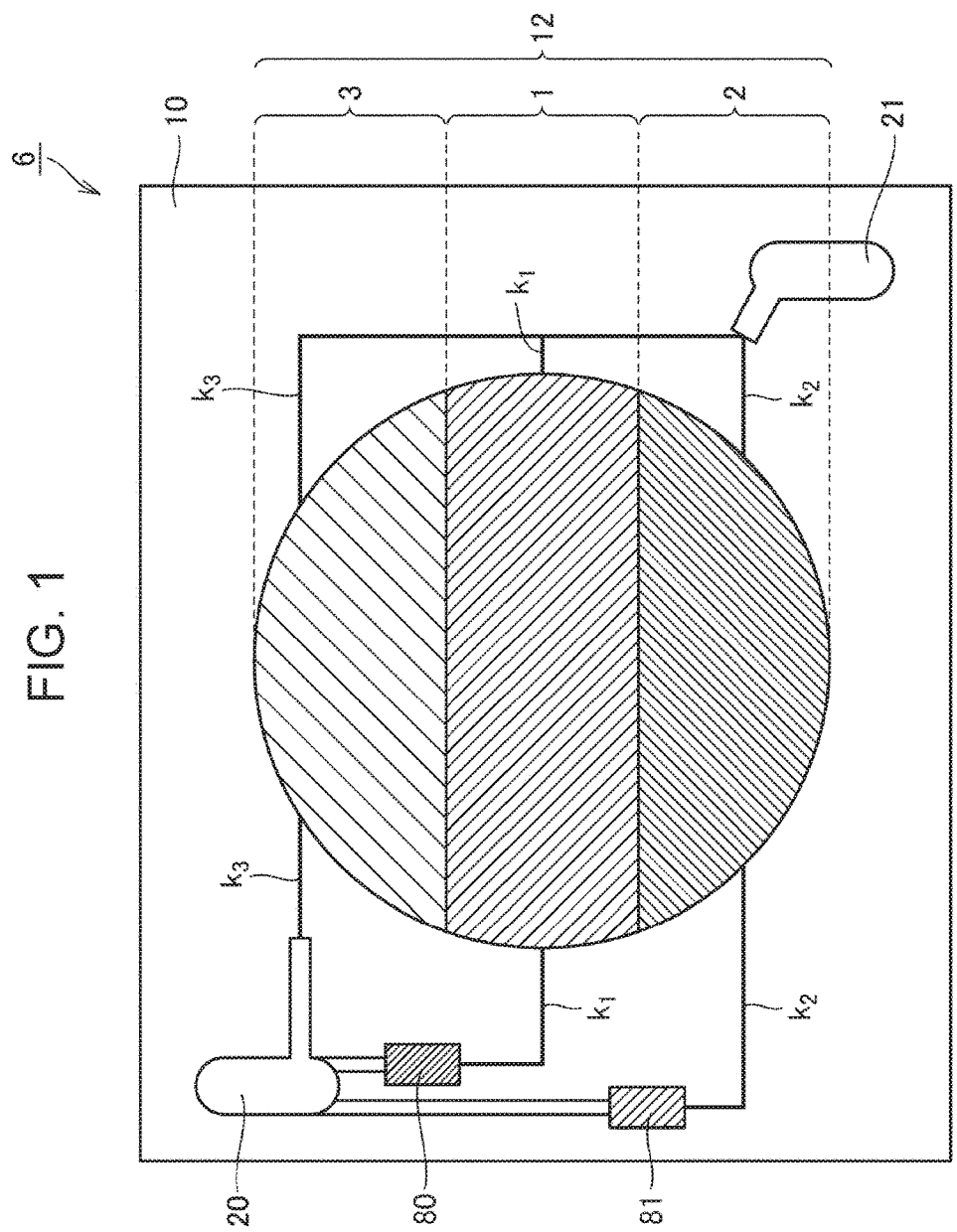
FIG. 1 is a plan view schematically illustrating a light-emitting device according to Embodiment 1 of the invention.

A light-emitting device of the invention will be described below with reference to drawings. Note that, the same reference signs represent the same portions or corresponding portions in the drawings of the invention. Dimensional relations such as a length, a width, a thickness, and a depth are appropriately changed for clarification and simplification in the drawings and do not represent actual dimensional relations.

[Embodiment 1]

A light-emitting device according to Embodiment 1 includes an anode electrode land, a cathode electrode land, and three or more wires that are provided in parallel and are connected to the anode electrode land and the cathode electrode land, in which at least three wires among the three or more wires have different forward current-forward voltage characteristics, are connected to different light-emitting portions, and a color temperature of light emitted from the whole of the light-emitting portions is able to be adjusted. In the present embodiment, the light-emitting device having three wires is specifically described with reference to FIG. 1. FIG. 1 is a plan view schematically illustrating the light-emitting device according to Embodiment 1 of the invention and FIG. 2 is a schematic perspective view of FIG. 1.

As illustrated in FIG. 1, a light-emitting device 6 includes, on a substrate 10, an anode electrode land 21, a cathode electrode land 20, a first wire $k_1$, a second wire $k_2$, and a third wire $k_3$ with which the anode electrode land 21 and the cathode electrode land 20 are connected. A resistor 80 is connected to the first wire $k_1$ and a resistor 81 is connected to the second wire $k_2$. A light-emitting portion 12 includes a first light-emitting portion 1 electrically connected to the first wire, a second light-emitting portion 2 electrically connected to the second wire, and a third light-emitting portion 3 electrically connected to the third wire. A color temperature of light emitted from the whole of the light-emitting portion 12 that includes the first light-emitting portion, the second light-emitting portion, and the third light-emitting portion is able to be adjusted.

Figure 2:
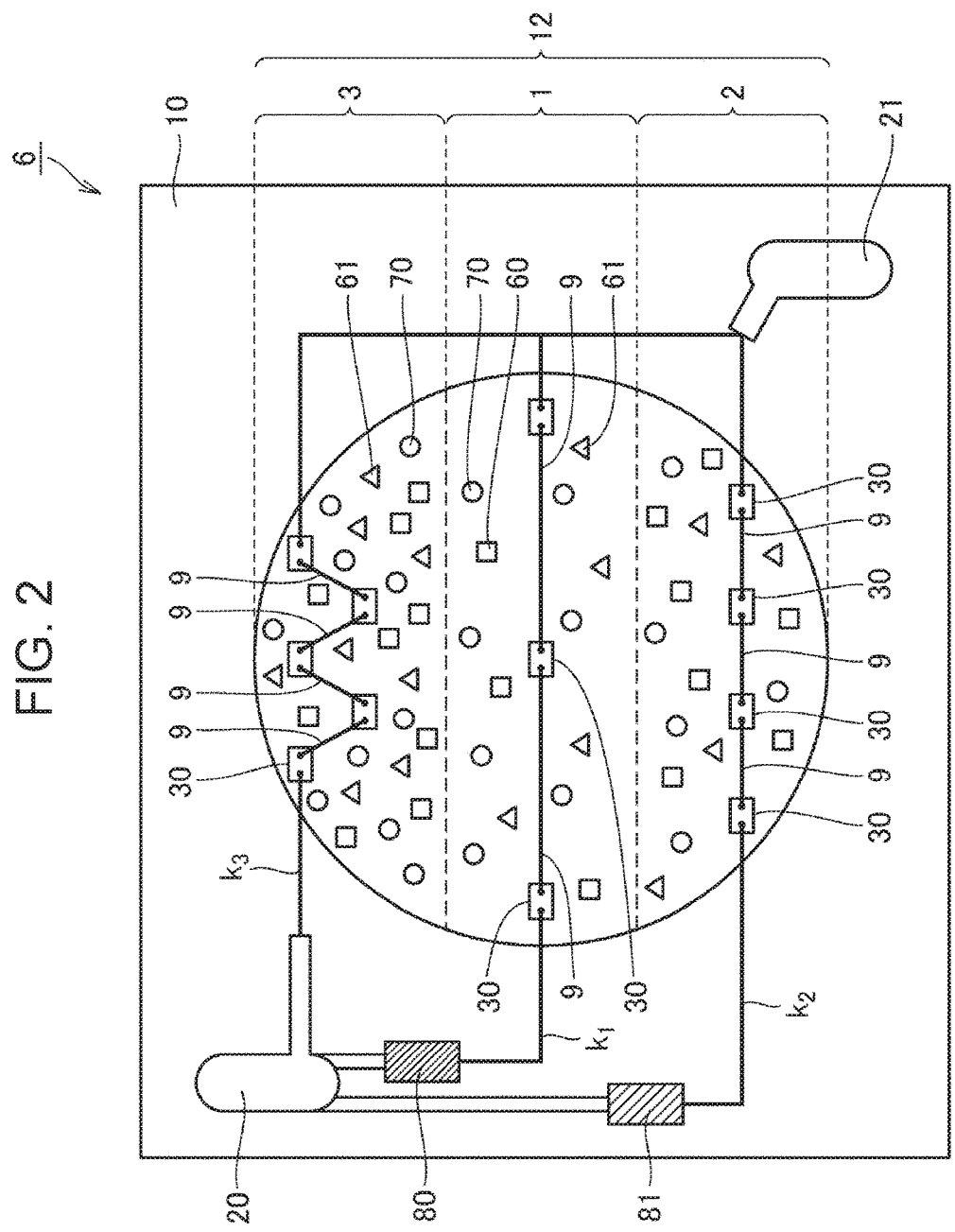
FIG. 2 is a schematic perspective view of the light-emitting device of FIG. 1.

As illustrated in FIG. 2, the first light-emitting portion 1 includes a first red phosphor 60, a second red phosphor 61, a green phosphor 70, an LED element 30, and a transparent resin. The second light-emitting portion 2 includes the first red phosphor 60, the second red phosphor 61, the green phosphor 70, the LED element 30, and the transparent resin. The third light-emitting portion 3 includes the first red phosphor 60, the second red phosphor 61, the green phosphor 70, the LED element 30, and the transparent resin. The anode electrode land 21, a plurality of LED elements 30, and the cathode electrode land 20 are electrically connected through wires 9.

The first light-emitting portion 1, the second light-emitting portion 2, and the third light-emitting portion 3 of the light-emitting device 6 emit light by power supplied from a signal power source. The light emitted from the first light-emitting portion 1, the light emitted from the second light-emitting portion 2, and the light from the third light-emitting portion 3 are mixed to be emitted outside as light from the light-emitting portion 12.

The first light-emitting portion 1, the second light-emitting portion 2, and the third light-emitting portion 3 each emit light having a different color temperature. When a ratio of current flowing through the first light-emitting portion 1, the second light-emitting portion 2, and the third light-emitting portion 3 is changed, the color temperature of light emitted from each of the first light-emitting portion 1, the second light-emitting portion 2, and the third light-emitting portion 3 is not changed, but a ratio of luminous flux of each of the light-emitting portions is changed. Accordingly, a color temperature of light from the whole of the light-emitting portion 12, which is mixed light of the light emitted from each of the first light-emitting portion 1, the second light-emitting portion 2, and the third light-emitting portion 3, is able to be changed.

FIG. 1 and FIG. 2 illustrate the light-emitting device in which the number of wires is three, but the number of wires is not particularly limited as long as being three or more. For example, in a case where the number of wires is four, the first light-emitting portion is connected to the first wire, the second light-emitting portion is connected to the second wire, the third light-emitting portion is connected to the third wire, and a fourth light-emitting portion is connected to a fourth wire.

(First Wire, Second Wire, Third Wire, Anode Electrode Land, Cathode Electrode Land, Resistor, Substrate)

The first wire $k_1$, the second wire $k_2$, and the third wire $k_3$ are arranged in parallel so that the anode electrode land 21 and the cathode electrode land 20 are connected. The first wire, the second wire, and the third wire are composed of wiring patterns and/or wires. The first wire, the second wire, and the third wire are formed on the substrate 10 by a screen printing method or the like. A protective device may be connected to at least any of the first wire, the second wire, and the third wire.

The anode electrode land 21 and the cathode electrode land 20 are electrodes for external connection (for example, used for power supply), are made of Ag—Pt or the like and formed by a screen printing method or the like.

The first wire $k_1$, the second wire $k_2$, and the third wire $k_3$ have different forward current-forward voltage characteristics. Here, the difference in the forward current-forward voltage characteristics of the wires means that an amount of change in the magnitude of the forward voltage of the wire with respect to an amount of change in the magnitude of the forward current applied to the wire is different among the wires.

The resistor 80 is connected to the first wire $k_1$, the resistor 81 is connected to the second wire $k_2$, and no resistor is connected to the third wire $k_3$. A resistance R1 of the resistor connected to the first wire and a resistance R2 of the resistor connected to the second wire may be equal or may be different, but are preferably different. A chip resistor or a printed resistor is able to be used as the resistor.

In Embodiment 1, the resistors are connected to the first wire and the second wire, but a resistor may be connected also to the third wire. In this case, values of the resistance R1 of the resistor connected to the first wire, the resistance R2 of the resistor connected to the second wire, and a resistance R3 of the resistor connected to the third wire may be all equal to each other, may be partially equal, or may be all different. Among them, it is preferable that resistors connected to the wires are selected so that the resistances of the resistors connected to the wires are all different from each other.

(Red Phosphor)

Each of the red phosphors 60 and 61 is excited by primary light radiated from the LED elements and radiates light having a peak emission wavelength in a red region. The red phosphor does not emit light in a range of the wavelength of 700 nm or more, and does not absorb light in a range of the wavelength of 550 nm or more and 600 nm or less. "The red phosphor does not emit light in the range of the wavelength of 700 nm or more" means that, at a temperature not lower than 300 K, emission intensity of the red phosphor in the range of the wavelength of 700 nm or more is equal to or lower than $\frac{1}{100}$ times as high as the emission intensity of the red phosphor in the peak emission wavelength. "The red phosphor does not absorb light in the range of the wavelength of 550 nm or more and 600 nm or less" means that, at a temperature not lower than 300 K, an integrated value of excitation spectrums of the red phosphor in the range of the wavelength of 550 nm or more and 600 nm or less is equal to or less than $\frac{1}{100}$ times as large as an integrated value of excitation spectrums of the red phosphor in the range of the wavelength of 430 nm or more and 480 nm or less. Note that, the excitation spectrum is measured at the peak wavelength of the red phosphor. In the present specification, the "red region" means a region having the wavelength of 580 nm or more and less than 700 nm.

Light emission of the red phosphor is not substantially seen in a long-wavelength region of 700 nm or more. In the long-wavelength region of 700 nm or more, a luminosity factor of a human is relatively small. Thus, when the light-emitting device is used for illumination, for example, use of the red phosphor that does not emit light in the range of the wavelength of 700 nm or more provides a great advantage.

Additionally, the red phosphor does not absorb light in the range of the wavelength of 550 nm or more and 600 nm or less and thus substantially not absorb secondary light from the green phosphor. Thus, occurrence of two stage light emission in which the red phosphor absorbs the secondary light emitted from the green phosphor and emits light is able to be prevented. Accordingly, light emission efficiency is kept high.

Though the red phosphor is not limited in particular as long as being used for a wavelength conversion portion of a light-emitting device, for example, a $(Sr,Ca)AlSiN_3$:Eu-based phosphor, a $CaAlSiN_3$:Eu-based phosphor or the like is able to be used.

(Green Phosphor)

The green phosphor 70 is excited by primary light radiated from the LED elements and radiates light having the peak emission wavelength in a green region. Though the green phosphor is not limited in particular as long as being used for a wavelength conversion portion of a light-emitting device, for example, a phosphor expressed by a general formula (1): $(M1)_{3-x}Ce_x(M2)_5O_{12}$ (in the formula, (M1) represents at least one of Y, Lu, Gd, and La, (M2) represents at least one of Al and Ga, and x indicating a composition ratio (concentration) of Ce satisfies $0.005 \leq x \leq 0.20$) or the like is able to be used. The "green region" means a region having the wavelength of 500 nm or more and 580 nm or less.

In a case where one kind of green phosphor (for example, for general illumination purpose or the like), it is preferable that a half-width of fluorescent spectrum of the green phosphor is wide, for example, 95 nm or more. A phosphor using Ce as an activator, for example, such as a $Lu_{3-x}Ce_xAl_5O_{12}$-based green phosphor expressed by the general formula (1) has a garnet crystal structure. The phosphor provides fluorescent spectrum having a wide half-width (the half-width is 95 nm or more) because Ce is used as the activator. Thus, the phosphor using Ce as the activator is a suitable green phosphor to obtain high color rending properties.

(LED Element)

Each of the LED elements 30 radiates light having the peak emission wavelength in a range of the wavelength of 430 nm or more and 480 nm or less. When a light-emitting element having the peak emission wavelength less than 430 nm is used, a contribution rate of a component of blue light to the light emitted from the light-emitting device becomes low, so that the color rending properties are deteriorated and thereby the light-emitting device may not be suitably used in practice. When an LED element having the peak emission wavelength exceeding 480 nm is used, the light-emitting device may not be suitably used in practice. Particularly, since an InGaN-based LED element causes a decrease in quantum efficiency, the light-emitting device is not suitably used apparently in practice.

The LED element is preferably an LED element that radiates light including blue component light having the peak emission wavelength in a blue region (a region whose wavelength is 430 nm or more and 480 nm or less), more preferably, an InGaN-based LED element. Examples of the LED element include an LED element having the peak emission wavelength in the vicinity of 450 nm. Here, the "InGaN-based LED element" means an LED element whose light-emitting layer is an InGaN layer.

The LED element has a structure in which light is radiated from an upper surface thereof. Additionally, the LED element includes, on a surface thereof, electrode pads (not illustrated; for example, an anode electrode pad and a cathode electrode pad) to connect adjacent LED elements and to connect the LED element and a wiring pattern through wires.

(First Light-emitting Portion, Second Light-emitting Portion, Third Light-emitting Portion)

Each of the first light-emitting portion 1, the second light-emitting portion 2, and the third light-emitting portion 3 (hereinafter, also described as a "light-emitting portion"

including the three light-emitting portions) has the LED elements 30, the transparent resin, and the green phosphor 70 and the red phosphors 60 and 61 which are uniformly dispersed in the transparent resin.

The first wire $k_1$ is electrically connected to the first light-emitting portion 1, the second wire $k_2$ is electrically connected to the second light-emitting portion 2, and the third wire $k_3$ is electrically connected to the third light-emitting portion 3.

In FIG. 1, the first light-emitting portion, the second light-emitting portion, and the third light-emitting portion are arranged within the same circle. It is desirable that the circle is divided so that the first light-emitting portion, the second light-emitting portion, and the third light-emitting portion have equal surface areas. Note that, as long as the color temperature of light emitted from each of the first light-emitting portion, the second light-emitting portion, and the third light-emitting portion is able to be adjusted, surface areas of the first light-emitting portion, the second light-emitting portion, and the third light-emitting portion may be different from each other.

It is desirable that the first light-emitting portion, the second light-emitting portion, and the third light-emitting portion are arranged adjacent to each other so that light emitted from the first light-emitting portion, light emitted from the second light-emitting portion, and light emitted from the third light-emitting portion are easily mixed. Note that, the first light-emitting portion, the second light-emitting portion, and the third light-emitting portion may not necessarily be in contact with each other as long as light emitted from the first light-emitting portion, light emitted from the second light-emitting portion, and light emitted from the third light-emitting portion are able to be mixed together. In this case, it is preferable that the first light-emitting portion, the second light-emitting portion, and the third light-emitting portion are arranged at such a short distance from each other that light emitted from any of the light-emitting portions is fully mixed with light emitted from the rest of the light-emitting portions.

A shape of the whole light-emitting portion including the first light-emitting portion, the second light-emitting portion, and the third light-emitting portion is not limited to the circle as illustrated in FIG. 1 as long as the shape allows light emitted from the first light-emitting portion, light emitted from the second light-emitting portion, and light emitted from the third light-emitting portion to be mixed together. For example, any shape such as a substantially rectangular shape, a substantially elliptical shape, or a polygonal shape may be adopted as the shape of the whole light-emitting portion. Each of the shapes of the first light-emitting portion, the second light-emitting portion, and the third light-emitting portion which are arranged in the whole light-emitting portion is also not limited in particular.

Arrangement of the first light-emitting portion, the second light-emitting portion, and the third light-emitting portion is not limited in particular as long as light emitted from the first light-emitting portion, light emitted from the second light-emitting portion, and light emitted from the third light-emitting portion are able to be mixed together. For example, the first light-emitting portion may be formed into a round shape, and the second light-emitting portion may be arranged to be in a doughnut-shape so as to surround a periphery of the first light-emitting portion, and the third light-emitting portion may be arranged to be in a doughnut-shape so as to further surround a periphery of the second light-emitting portion. Consequently, light emitted from the first light-emitting portion, light emitted from the second light-emitting portion, and light emitted from the third light-emitting portion are easily mixed and the whole light-emitting portion is able to emit light at a more uniform color temperature.

It is preferable that the number N1 of the series-connected LED elements (the number N1 of the LED elements connected in series on the first wire) included in the first light-emitting portion 1, the number N2 of the series-connected LED elements (the number N2 of the LED elements connected in series on the second wire) included in the second light-emitting portion 2, the number N3 of the series-connected LED elements (the number N3 of the LED elements connected in series on the third wire) included in the third light-emitting portion 3 are all different. For example, it is preferable that values of N1, N2, and N3 satisfy $N1:N2:N3=(n-2):(n-1):n(3 \leq n \leq 8)$.

For example, in a case where the resistance R1 of the resistor connected to the first wire, the resistance R2 of the resistor connected to the second wire, and the resistance R3 of the resistor connected to the third wire are all different and the numbers N1, N2 and N3 of the series-connected LED elements which are included in the respective light-emitting portions are all different, when a constant current is caused to flow through the light-emitting device, different voltage values are able to be obtained in the first wire, the second wire, and the third wire.

In the light-emitting portion, part of primary light (for example, blue light) radiated from the LED elements is converted to green light and red light. Thus, the light-emitting device according to the present embodiment emits mixed light of the primary light, the green light, and the red light, or preferably emits white-based light. Note that, a mixing ratio of the green phosphor to the red phosphor is not limited in particular, and it is preferable that the mixing ratio is set so that desired characteristics are achieved.

The transparent resin included in the light-emitting portion is not limited as long as the resin has translucency, and is preferably epoxy resin, silicone resin, urea resin, or the like, for example. Note that, the light-emitting portion may include an additive, for example, such as $SiO_2$, $TiO_2$, $ZrO_2$, $Al_2O_3$, or $Y_2O_3$ in addition to the transparent resin, the green phosphor, and the red phosphors. In a case where the light-emitting portion includes such an additive, an effect of preventing sedimentation of the phosphors such as the green phosphor and the red phosphors, an effect of diffusing light emitted from each of the LED elements, the green phosphor, and the red phosphors, or the like is achieved.

Luminous flux of light emitted from the first light-emitting portion, luminous flux of light emitted from the second light-emitting portion, and luminous flux of light emitted from the third light-emitting portion are able to be adjusted respectively by changing the magnitude of the current flowing through the first wire, the second wire, and third wire.

When the current flowing through each of the light-emitting portions is set as a rated current value, a color temperature (hereinafter, also referred to as Tcmax) of light emitted from the whole light-emitting device, which is mixture of the light emitted from the first light-emitting portion, the light emitted from the second light-emitting portion, and the light emitted from the third light-emitting portion, is preferably 2700 K to 6500 K.

An example of a light-emitting state of the light-emitting portions when a relation between the resistance R1 of the resistor 80 connected to the first wire $k_1$ and the resistance R2 of the resistor 81 connected to the second wire $k_2$ is R1<R2 and the number of the LED elements 30 included in the first light-emitting portion 1 is three, the number of the LED elements 30 included in the second light-emitting portion 2 is four, and the number of the LED elements 30 included in the third light-emitting portion 3 is five in the light-emitting device 6 illustrated in FIG. 1 will be described below.

When a current value of the current applied to the light-emitting device 6 is gradually increased from a state in which no current flows through the light-emitting device 6, first, the current gradually flows through the first wire $k_1$ which is connected between the resistor 80 whose resistance is R1 and the first light-emitting portion 1 which includes the three LED elements 30 connected in series. At this time, the current does not substantially flow through the second wire $k_2$ and the third wire $k_3$. Next, when the current value of the current applied to the light-emitting device 6 is further increased, the current gradually flows through the second wire $k_2$ which is connected between the resistor 81 whose resistance is R2 and the second light-emitting portion 2 which includes the four LED elements 30 connected in series, in addition to the first wire $k_1$. At this time, the current does not substantially flow through the third wire. Next, when the current value is further increased, the current also flows through the third wire $k_3$ to which no resistor is connected and which is connected to the third light-emitting portion 3 which includes the five LED elements 30 connected in series, in addition to the first wire $k_1$ and the second wire $k_2$. That is, when the value of the current applied to the light-emitting device 6 is gradually increased from a state in which no current flows through the light-emitting device 6, first, the first light-emitting portion gradually emits light, and when the current value is further increased gradually, the second light-emitting portion gradually emits light in addition to the first light-emitting portion, and when the current value is further increased gradually, the third light-emitting portion gradually emits light in addition to the first light-emitting portion and the second light-emitting portion.

In a case where the color temperature of the first light-emitting portion is 2700 K, the color temperature of the second light-emitting portion is 3500 K, and the color temperature of the third light-emitting portion is 6500 K, when the current value of the current applied to the light-emitting device is gradually increased from a state in which no current flows through the light-emitting device, the color temperatures are changed along a locus of blackbody radiation and the luminous flux is also gradually increased.

In a case where the current flowing through each of the light-emitting portions is set as a rated current value, when the luminous flux of light emitted from the whole light-emitting device is 100%, and the luminous flux of light emitted from the whole light-emitting device is adjusted to be 20% by reducing the magnitude of the current, the color temperature of light emitted from the whole light-emitting device is preferably lower than the Tcmax by 300 K or more because the color temperature in a wide range is able to be obtained.

The light-emitting device of Embodiment 1 has the three wires of the first wire electrically connected to the first light-emitting portion, the second wire electrically connected to the second light-emitting portion, and the third wire electrically connected to the third light-emitting portion, but the number of the wires is not limited to three and may be three or more. The number of the light-emitting portions may be the same as the number of the wires.

Figure 3:
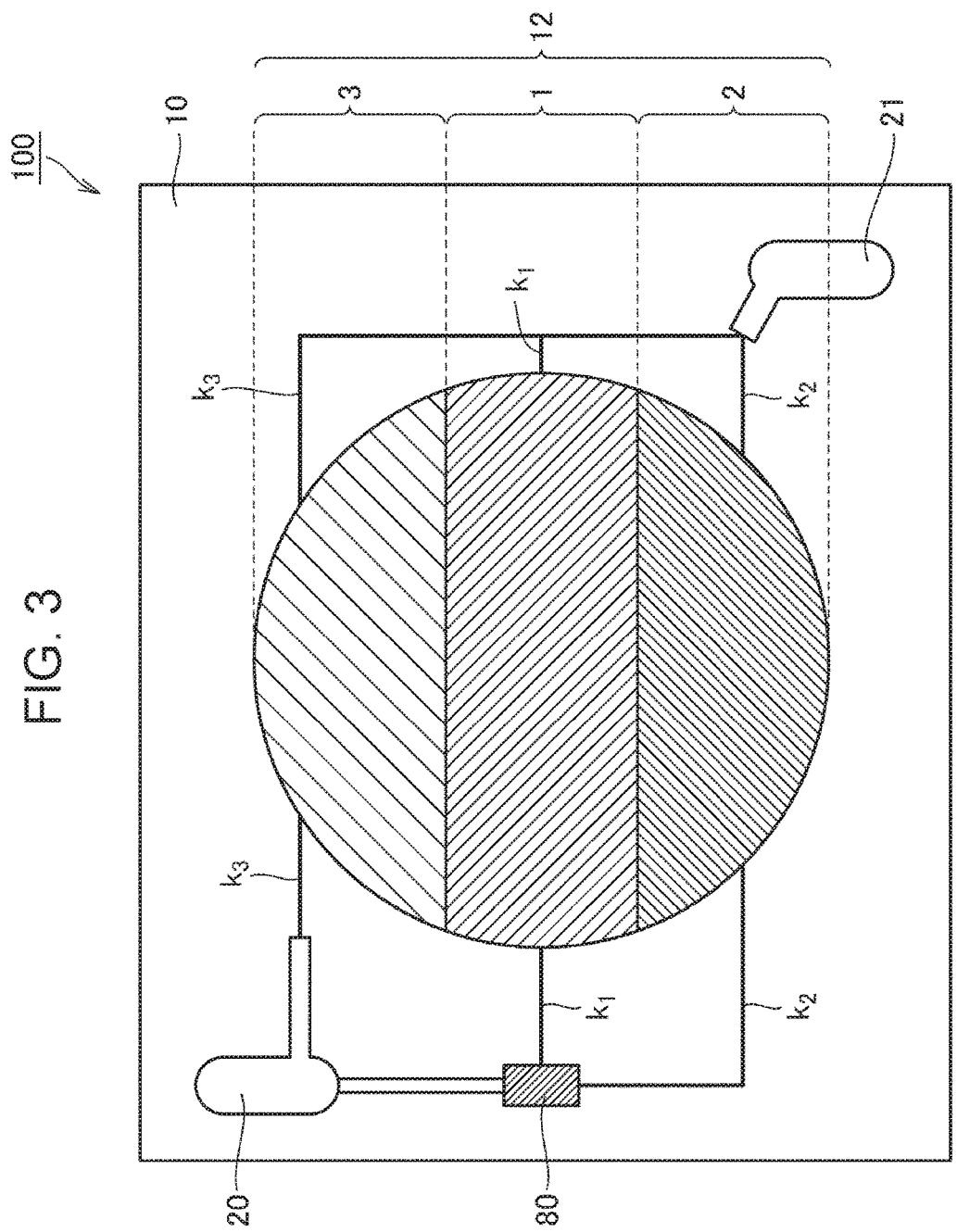
FIG. 3 is a plan view of a modification of the light-emitting device according to Embodiment 1 of the invention.
Figure 4:
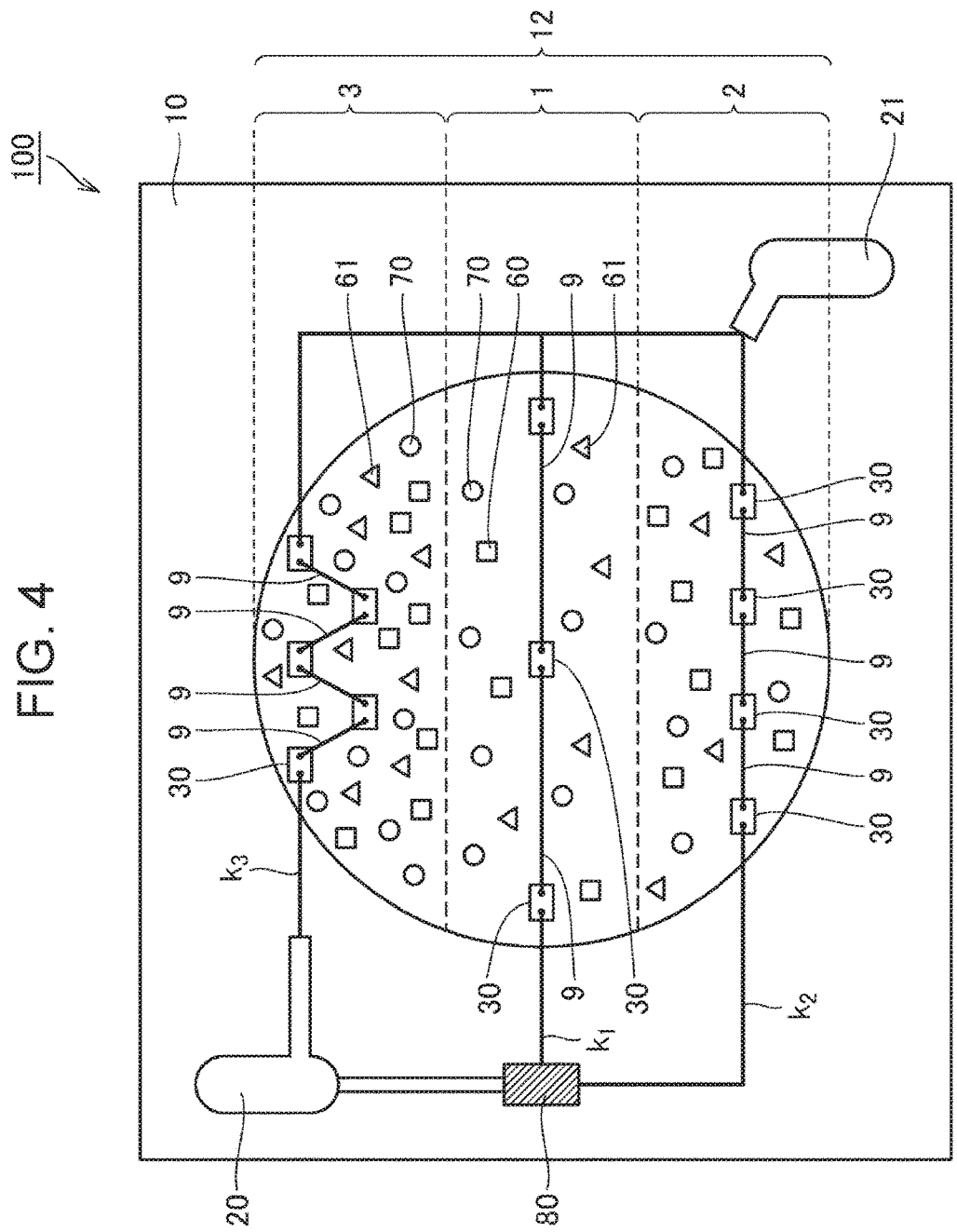
FIG. 4 is a schematic perspective view of a modification of the light-emitting device of FIG. 3.

FIG. 3 is a plan view of a modification of the light-emitting device according to Embodiment 1 of the invention and FIG. 4 is a schematic perspective view of the light-emitting device of FIG. 3. A light-emitting device 100 according to the modification has, as a basic constitution, a constitution similar to that of the light-emitting device 6 according to Embodiment 1. A difference from Embodiment 1 lies in that the resistor 80 is connected to the first wire and the second wire.

[Embodiment 2]

Figure 5:
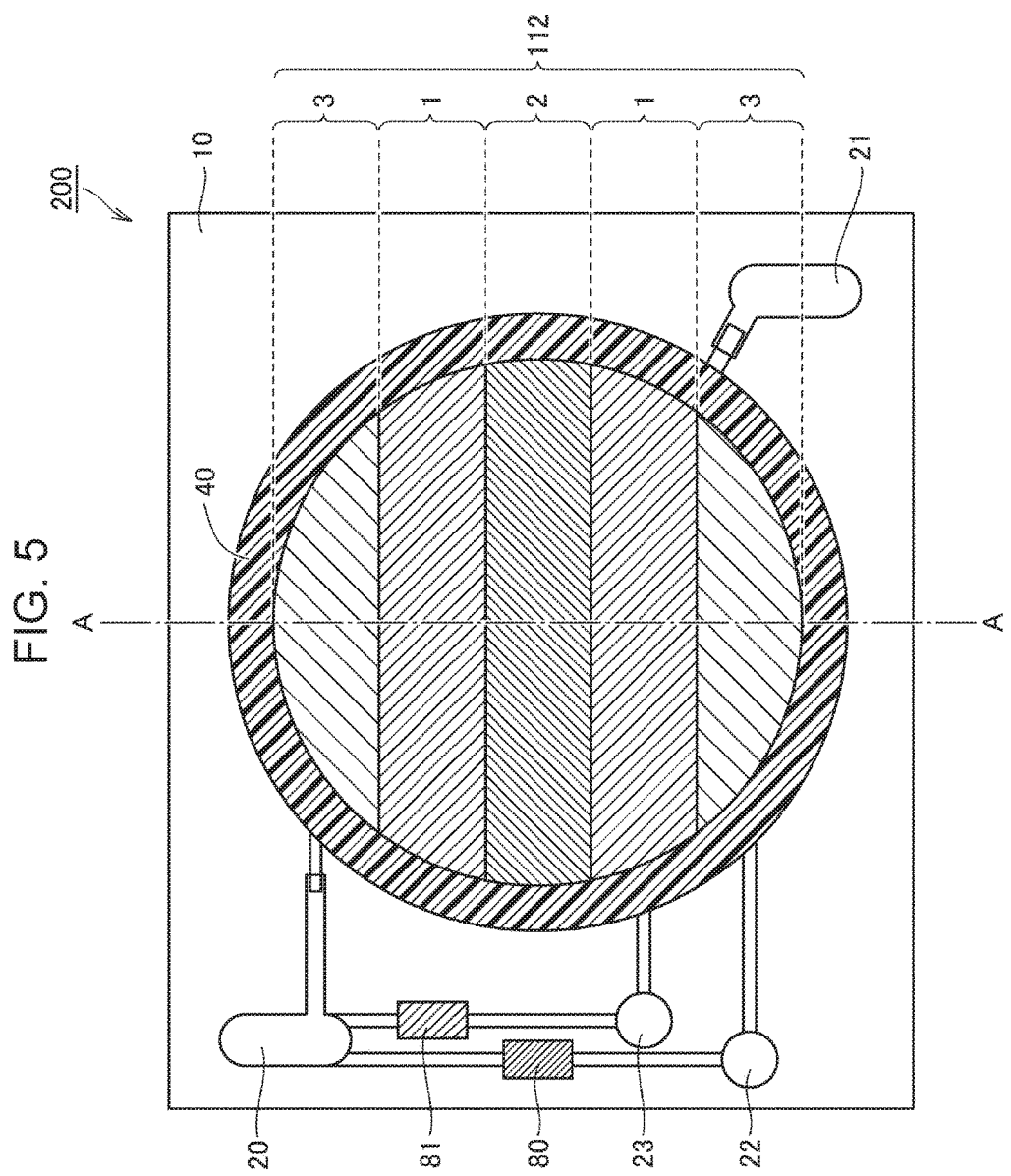
FIG. 5 is a plan view schematically illustrating a light-emitting device according to Embodiment 2 of the invention.
Figure 6:
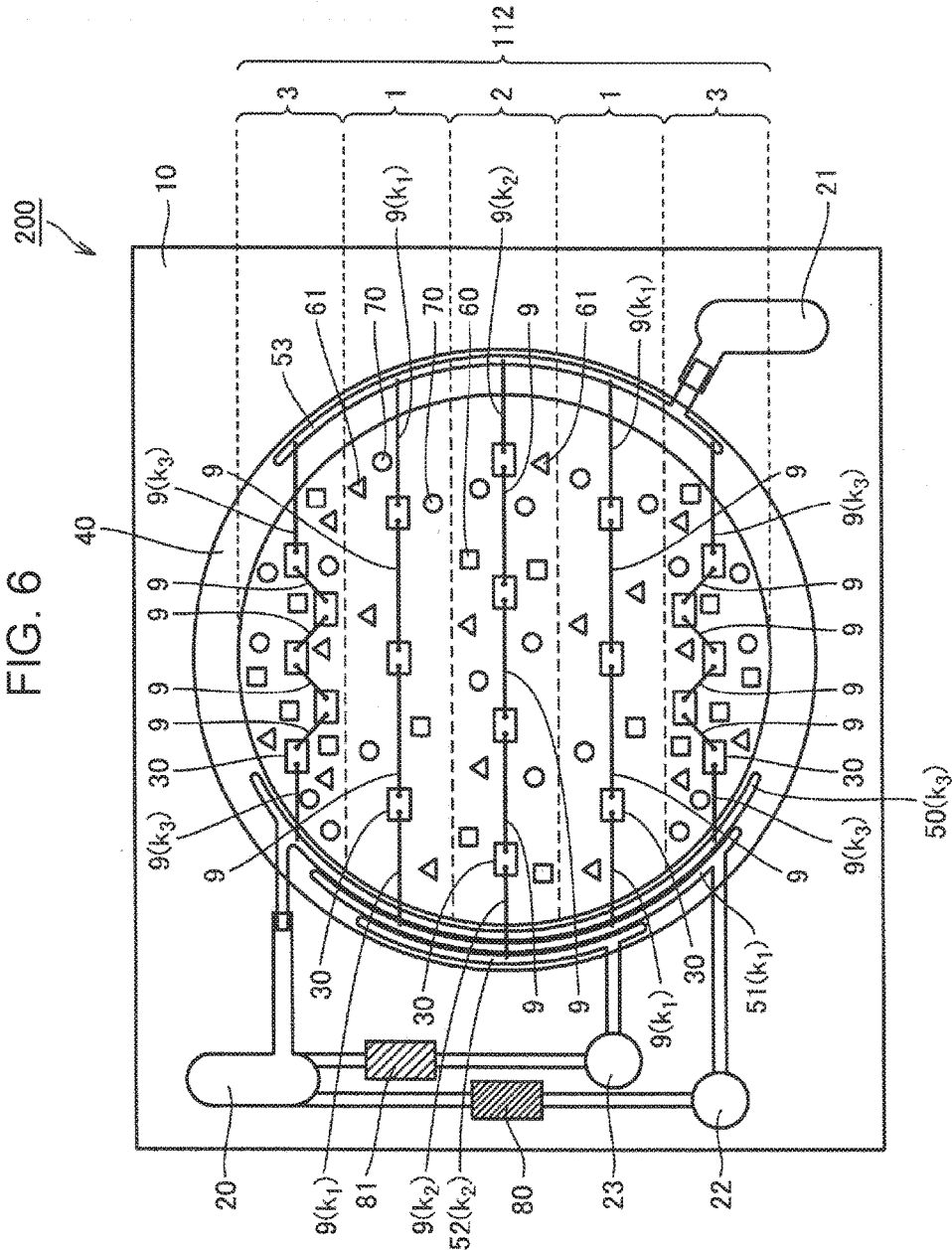
FIG. 6 is a schematic perspective view of the light-emitting device of FIG. 5.
Figure 7:
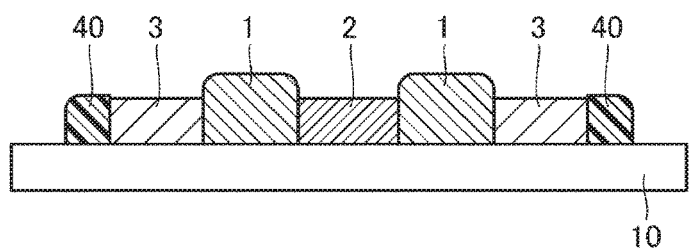
FIG. 7 is a cross-sectional view taken along a line A-A of the light-emitting device of FIG. 5.

FIG. 5 is a plan view schematically illustrating a light-emitting device according to Embodiment 2 of the invention, FIG. 6 is a schematic perspective view of the light-emitting device of FIG. 5, and FIG. 7 is a cross-sectional view taken along a line A-A of the light-emitting device of FIG. 5.

A light-emitting device 200 according to the present embodiment has, as a basic constitution, a constitution similar to that of the light-emitting device 6 according to Embodiment 1. A difference from Embodiment 1 lies in that two first light-emitting portions 1, one second light-emitting portion 2, and two third light-emitting portions 3 are arranged, a resin dam 40 is arranged outside the light-emitting portions so as to surround the light-emitting portions, a resistance monitor land 22 is connected to the first wire, a resistance monitor land 23 is connected to the second wire, an anode electrode land 20 and a cathode electrode land 21 are connected through wires 9 constituting the wires $k_1$, $k_2$, and $k_3$ and wiring patterns 50, 51, 52, and 53.

The first wire $k_1$ is electrically connected to each of the two first light-emitting portions 1 and the two first light-emitting portions 1 are arranged in parallel on the first wire $k_1$. The second wire $k_2$ is electrically connected to the one second light-emitting portion 2. The third wire $k_3$ is electrically connected to each of the two third light-emitting portions 3 and the two third light-emitting portions 3 are arranged in parallel on the third wire $k_3$.

FIG. 5 and FIG. 6 illustrate a light-emitting device in which the number of wires is three, but the number of the wires is not particularly limited as long as being three or more. For example, in a case where the number of the wires is four, the first light-emitting portion is connected to the first wire, the second light-emitting portion is connected to the second wire, the third light-emitting portion is connected to the third wire, and a fourth light-emitting portion is connected to a fourth wire. The number of the light-emitting portions connected in parallel may also be any number of one or more.

In Embodiment 2, a contact area between the first light-emitting portion 1 and the second light-emitting portion 2 and a contact area between the first light-emitting portion 1 and the third light-emitting portion 3 are made larger by increasing the number of the first light-emitting portions 1 and the third light-emitting portions 3 than those in Embodiment 1. Consequently, light emitted from the first light-emitting portion 1, light emitted from the second light-emitting portion 2, and light emitted from the third-emitting portion 3 are easily mixed together, and the light-emitting device is able to emit light at a more uniform color temperature.

The resistor 80 and the resistance monitor land 22 are electrically connected between the cathode electrode land 20 and the first light-emitting portions 1, and the resistor 81 and the resistance monitor land 23 are arranged to be electrically connected between the cathode electrode land 20 and the second light-emitting portion 2. The resistors 80 and 81 are chip resistors and are apart from the cathode electrode land and the resistance monitor land and do not hinder soldering work, so that the soldering is able to be performed easily. It is preferable that the resistors 80 and 81 are covered with phosphor-containing resin or colored resin.

[Resin Dam]

The resin dam 40 is resin for damming up the first light-emitting portion 1, the second light-emitting portion 2, and the third light-emitting portion 3, which include the transparent resin. The resin dam 40 is preferably made of a colored material (which may be white, milky white, red, yellow, or green material that absorbs less light). It is preferable that the resin dam 40 is formed to cover the wiring patterns 50, 51, 52, and 53 because absorption of light radiated from the LED elements or light converted by the phosphors is able to be reduced.

(First Light-emitting Portion, Second Light-emitting Portion, Third Light-emitting Portion)

As illustrated in FIG. 5, the first light-emitting portions 1, the second light-emitting portion 2, and the third light-emitting portions 3 are arranged within the resin dam 40. The first light-emitting portions 1, the second light-emitting portion 2, and the third light-emitting portions 3 are able to be formed by the following method. The green phosphor and the red phosphor are uniformly mixed into the transparent resin. The mixed resin that is obtained is injected inside of the resin dam and is subjected to heat treatment. The transparent resin is cured through the heat treatment and thus the green phosphor and the red phosphor are sealed.

It is preferable that the first light-emitting portion 1 has a higher thixotropy than those of the second light-emitting portion 2 and the third light-emitting portion 3. When the first light-emitting portion 1 has a higher thixotropy than those of the second light-emitting portion 2 and the third light-emitting portion 3, as illustrated in FIG. 7, the surface of the first light-emitting portion 1 is at a level higher than those of the second light-emitting portion 2 and the third light-emitting portion 3. Accordingly, the first light-emitting portion 1 is able to function as a resin dam for the second light-emitting portion 2 and the third light-emitting portion 3. Furthermore, when the first light-emitting portion 1 has a higher thixotropy than those of the second light-emitting portion 2 and the third light-emitting portion 3, mixing of the phosphors and the like which are included in a light-emitting portion with or into those included in another light-emitting portions is able to be reduced.

[Embodiment 3]

Figure 8:
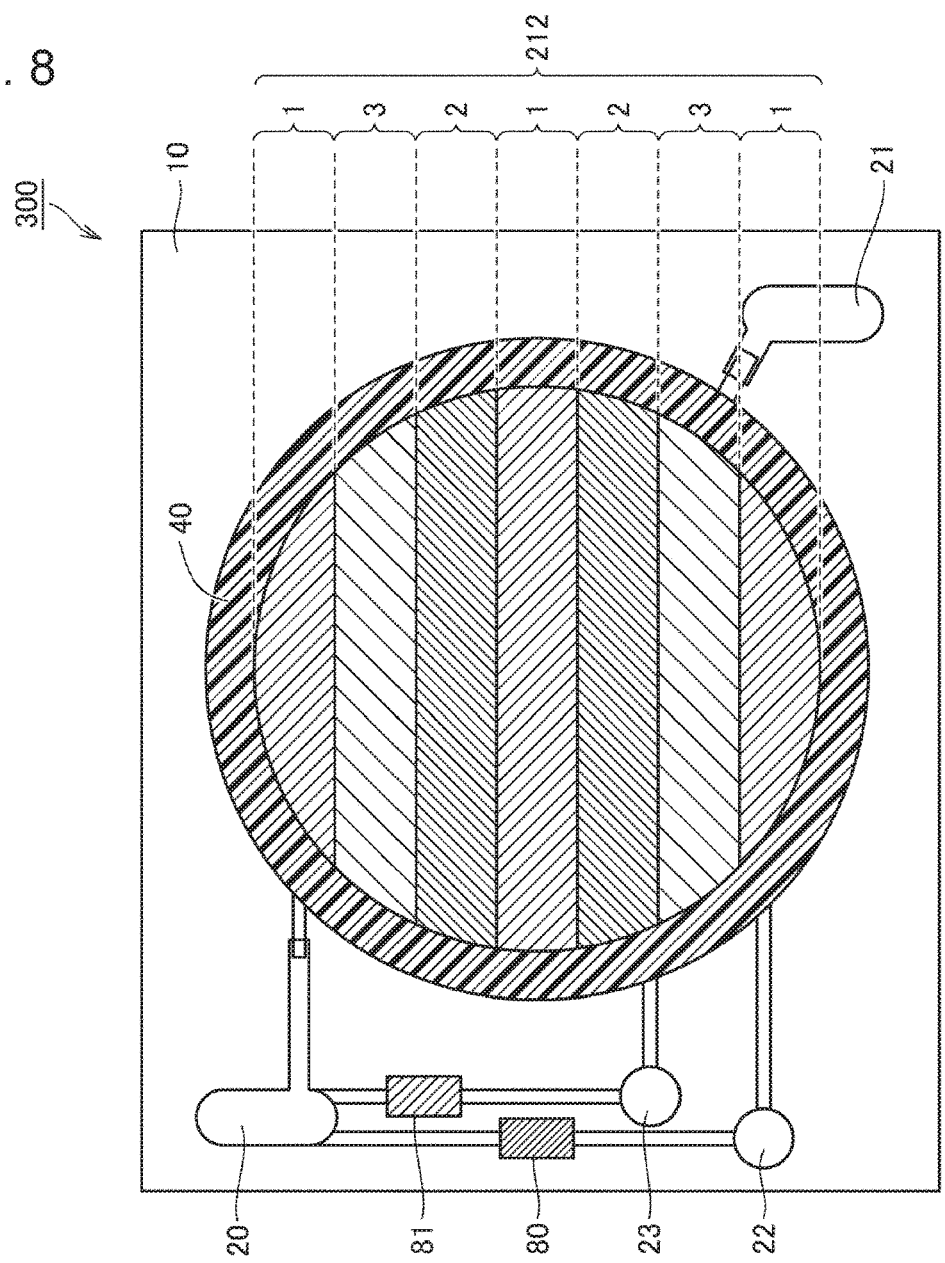
FIG. 8 is a plan view schematically illustrating a light-emitting device according to Embodiment 3 of the invention.
Figure 9:
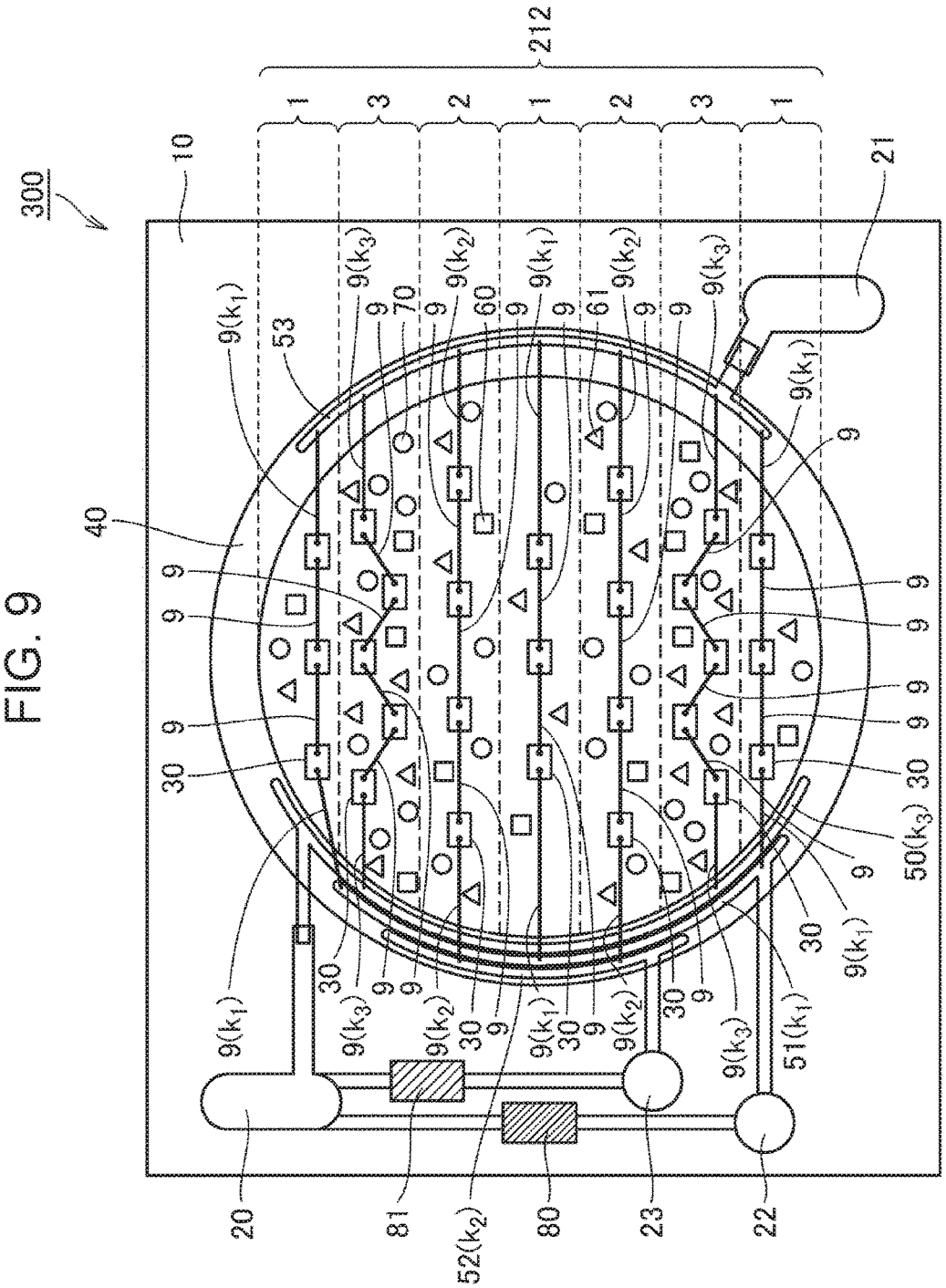
FIG. 9 is a schematic perspective view of the light-emitting device of FIG. 8.

FIG. 8 is a plan view schematically illustrating a light-emitting device according to Embodiment 3 of the invention and FIG. 9 is a schematic perspective view of the light-emitting device of FIG. 8.

A light-emitting device 300 according to the present embodiment has, as a basic constitution, a constitution similar to that of the light-emitting device 200 according to Embodiment 2. A difference from Embodiment 2 lies in that three first light-emitting portions 1, two second light-emitting portions 2, and two third light-emitting portions 3 are arranged.

The first wire $k_1$: the wiring pattern 51 is electrically connected to each of the three first light-emitting portions 1 and the three first light-emitting portions 1 are arranged in parallel on the first wire $k_1$. The second wire $k_2$: the wiring pattern 52 is electrically connected to each of the two second light-emitting portions 2 and the two second light-emitting portions 2 are arranged in parallel on the second wire $k_2$. The third wire $k_3$: the wiring pattern 50 is electrically connected to each of the two third light-emitting portions 3 and the two third light-emitting portions 3 are arranged in parallel on the third wire $k_3$.

FIG. 8 and FIG. 9 illustrate a light-emitting device in which the number of wires is three, but the number of the wires is not particularly limited as long as being three or more. For example, in a case where the number of the wires is four, the first light-emitting portion is connected to the first wire, the second light-emitting portion is connected to the second wire, the third light-emitting portion is connected to the third wire, and a fourth light-emitting portion is connected to a fourth wire. The number of the light-emitting portions connected in parallel may also be any number of one or more.

In Embodiment 3, a contact area between the first light-emitting portion 1 and the second light-emitting portion 2, a contact area between the second light-emitting portion 2 and the third light-emitting portion 3, and a contact area between the first light-emitting portion 1 and the third light-emitting portion 3 are made larger by increasing the number of the first light-emitting portions 1 and the second light-emitting portions 2 than those in Embodiment 2. Consequently, light emitted from the first light-emitting portion 1, light emitted from the second light-emitting portion 2, and light emitted from the third-emitting portion 3 are easily mixed together, and the light-emitting device is able to emit light at a more uniform color temperature.

[Embodiment 4]

Figure 10:
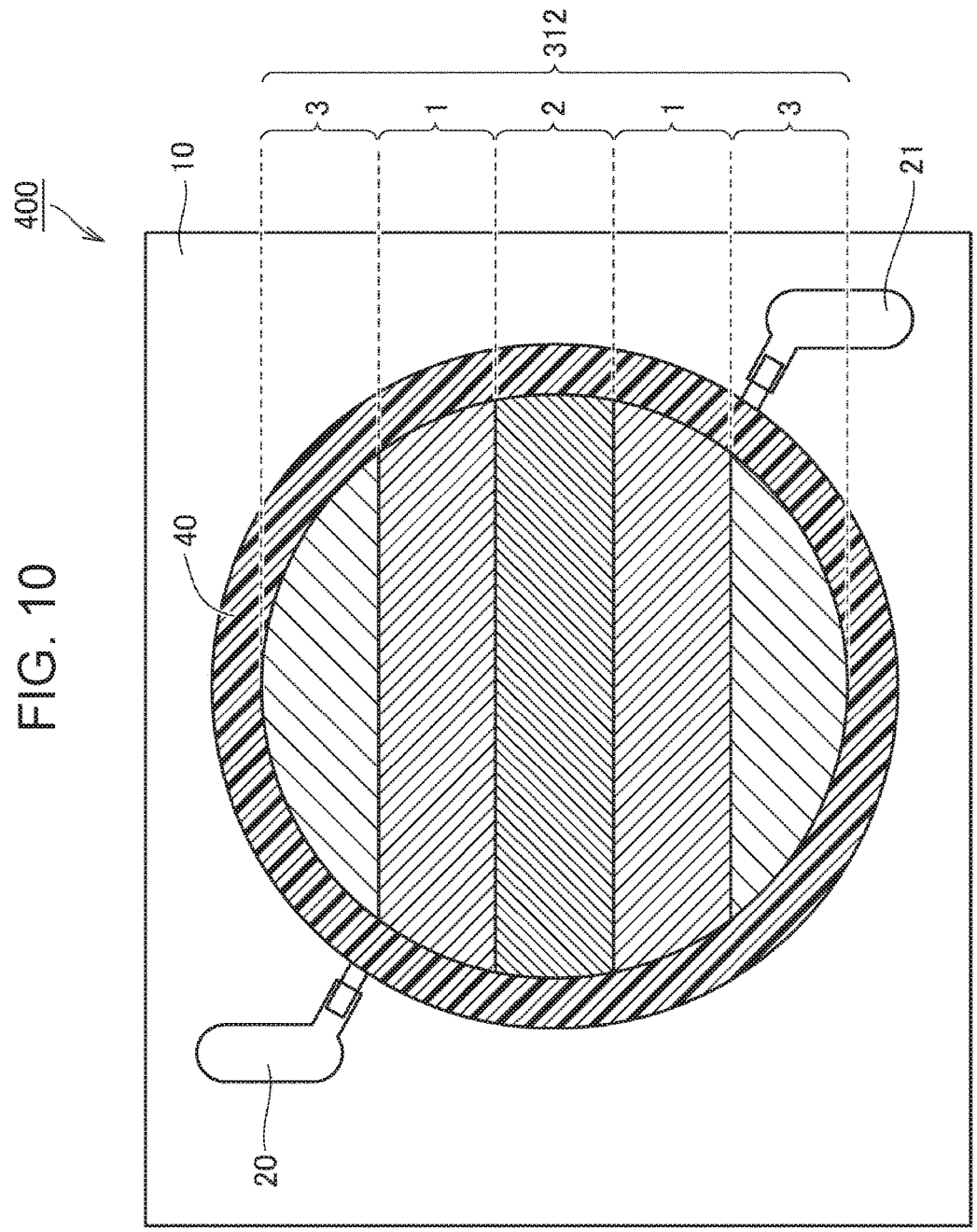
FIG. 10 is a plan view schematically illustrating a light-emitting device according to Embodiment 4 of the invention.
Figure 11:
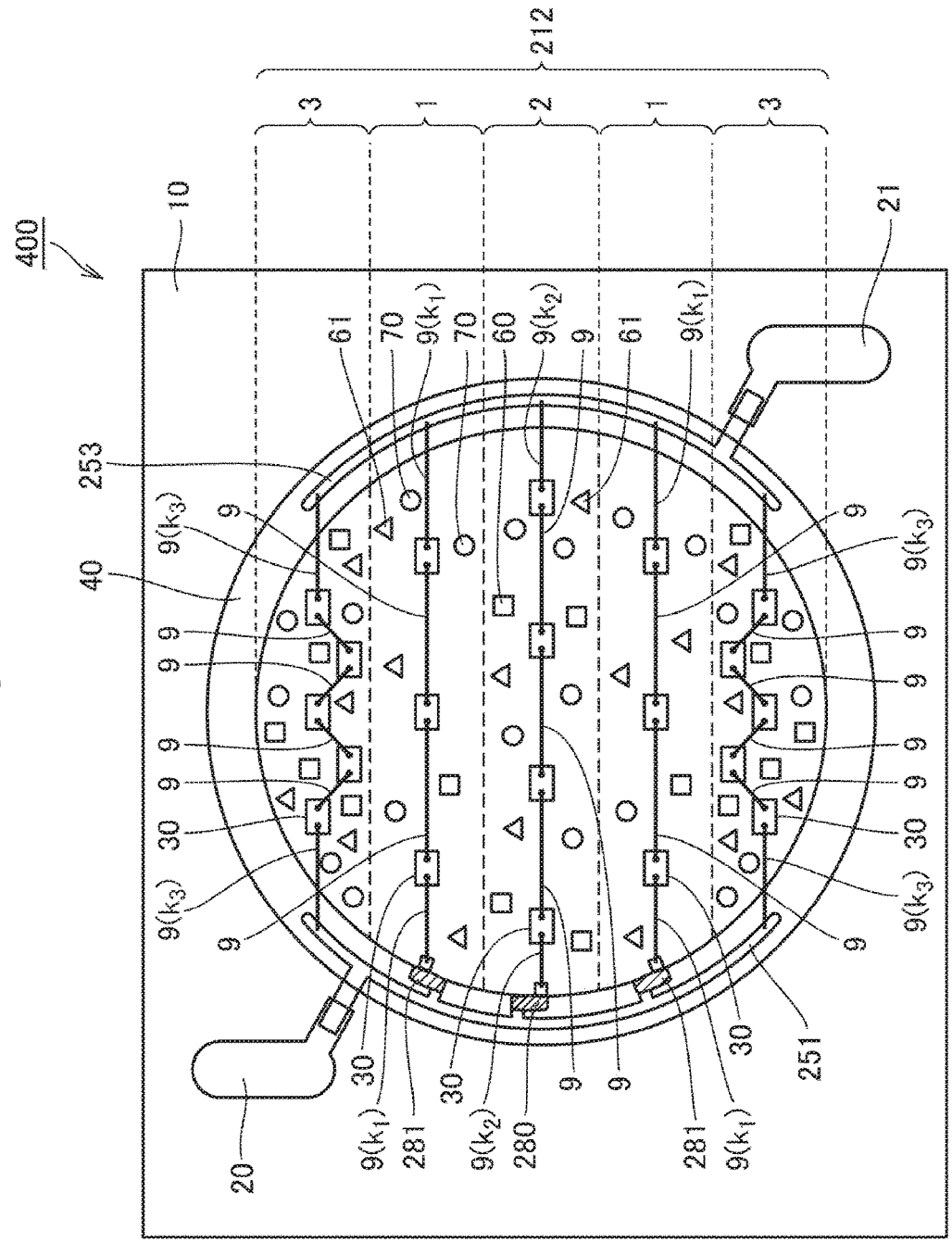
FIG. 11 is a schematic perspective view of the light-emitting device of FIG. 10.

FIG. 10 is a plan view schematically illustrating a light-emitting device according to Embodiment 4 of the invention and FIG. 11 is a schematic perspective view of the light-emitting device of FIG. 10.

A light-emitting device 400 according to the present embodiment has, as a basic constitution, a constitution similar to that of the light-emitting device 200 according to Embodiment 2. A difference from Embodiment 2 lies in that a resistor 280 is arranged between a wiring pattern 251 and the second light-emitting portion 2, a resistor 281 is arranged between a wiring pattern 251 and the first light-emitting portion 1, the resistors 280 and 281 are covered with the resin dam 40, the first light-emitting portion 1, the second light-emitting portion 2, and the third light-emitting portion 3 are electrically connected to the same wiring pattern 251, and no resistance monitor land is provided. When at least a part of the resistor is covered with the resin dam, light absorbed by the resistor is able to be reduced and light emission efficiency of the light-emitting device is improved. It is preferable that all of the resistors and the wiring patterns are covered with the resin dam.

[Embodiment 5]

Figure 12:
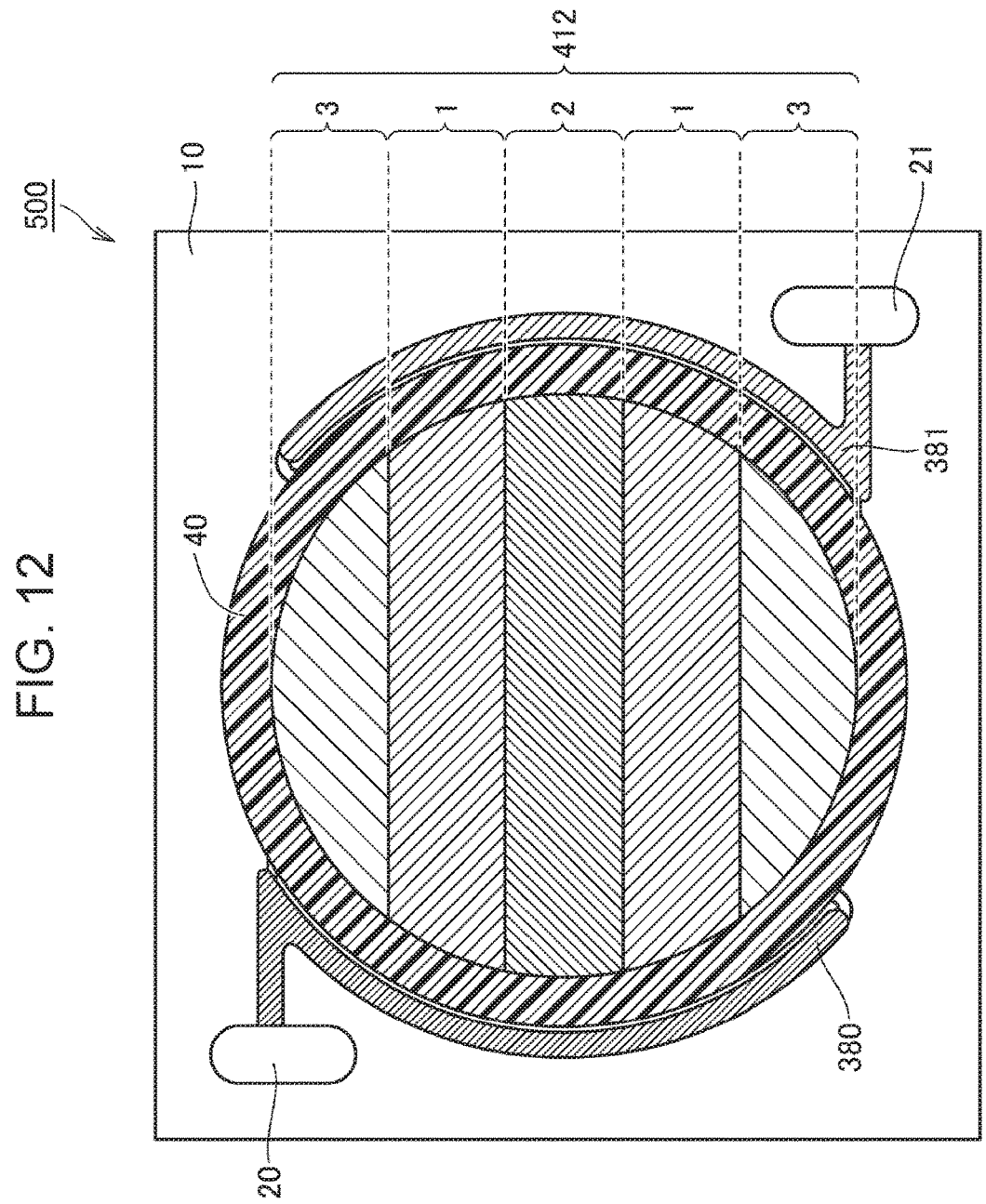
FIG. 12 is a plan view schematically illustrating a light-emitting device according to Embodiment 5 of the invention.
Figure 13:
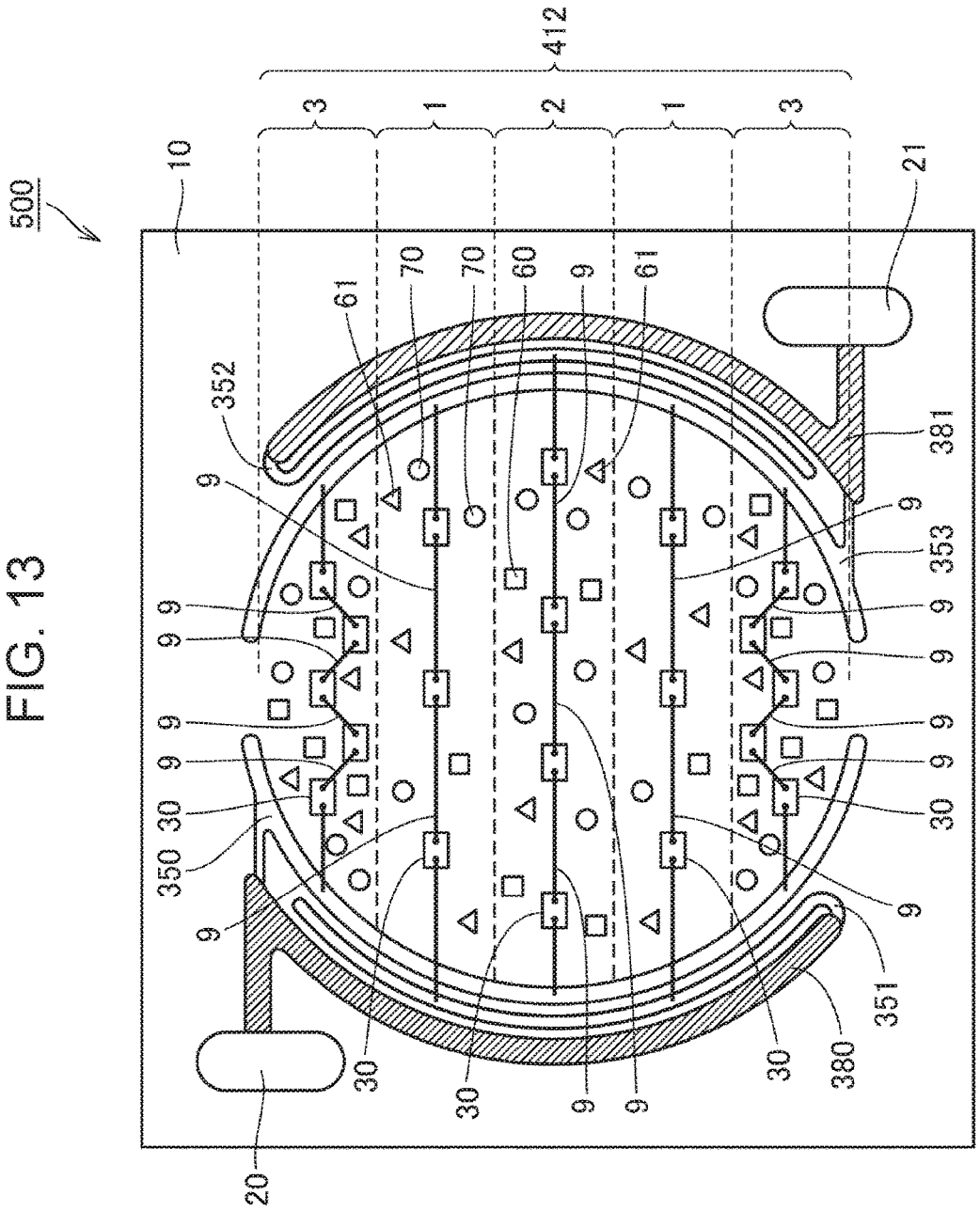
FIG. 13 is a schematic perspective view of the light-emitting device of FIG. 12.

FIG. 12 is a plan view schematically illustrating a light-emitting device according to Embodiment 5 of the invention and FIG. 12 is a schematic perspective view of the light-emitting device of FIG. 13.

A light-emitting device according to the present embodiment has, as a basic constitution, a constitution similar to that of the light-emitting device 200 according to Embodiment 2. A difference from Embodiment 2 lies in that the cathode electrode land 20, a resistor 380, and wiring patterns 350 and 351 are electrically connected, the anode electrode land 321, a resistor 381, and wiring patterns 352 and 353 are electrically connected, the resistors 380 and 381 are printed resistors and are not covered with the resin dam 40, the first light-emitting portion 1 is electrically connected to the wiring patterns 351 and 353, the second light-emitting portion 2 is electrically connected to the wiring patterns 350 and 352, the third light-emitting portion 303 is electrically connected to the wiring patterns 350 and 353, and no resistance monitor land is provided. For easier manufacturing, it is preferable that a printed resistor is used as the resistor. When resistors 380 and 381 are at a level lower than the resin dam 40, light absorbed by the resistor is able to be reduced and light emission efficiency of the light-emitting device is improved.

Figure 14:
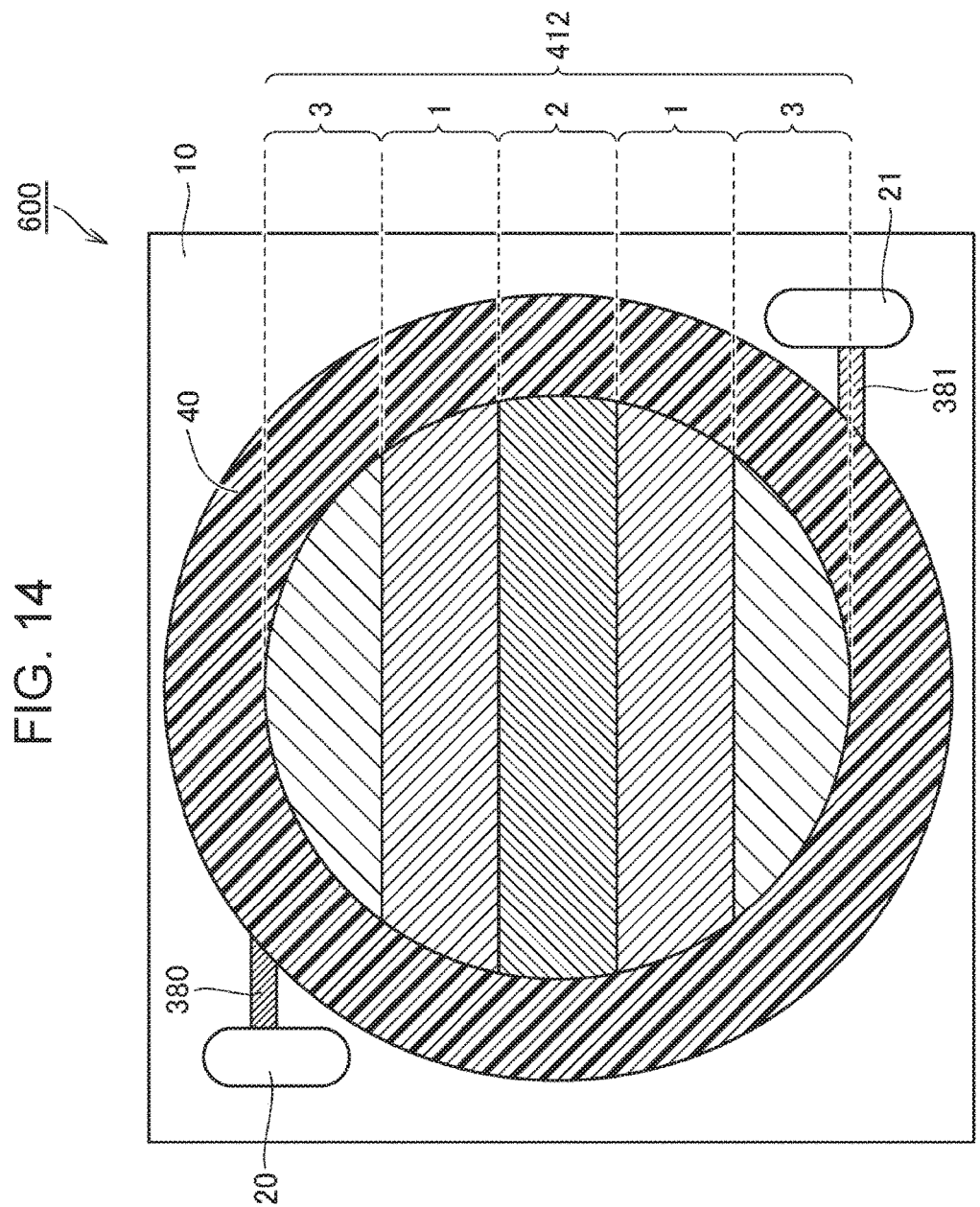
FIG. 14 is a plan view of a modification of the light-emitting device according to Embodiment 5 of the invention.
Figure 15:
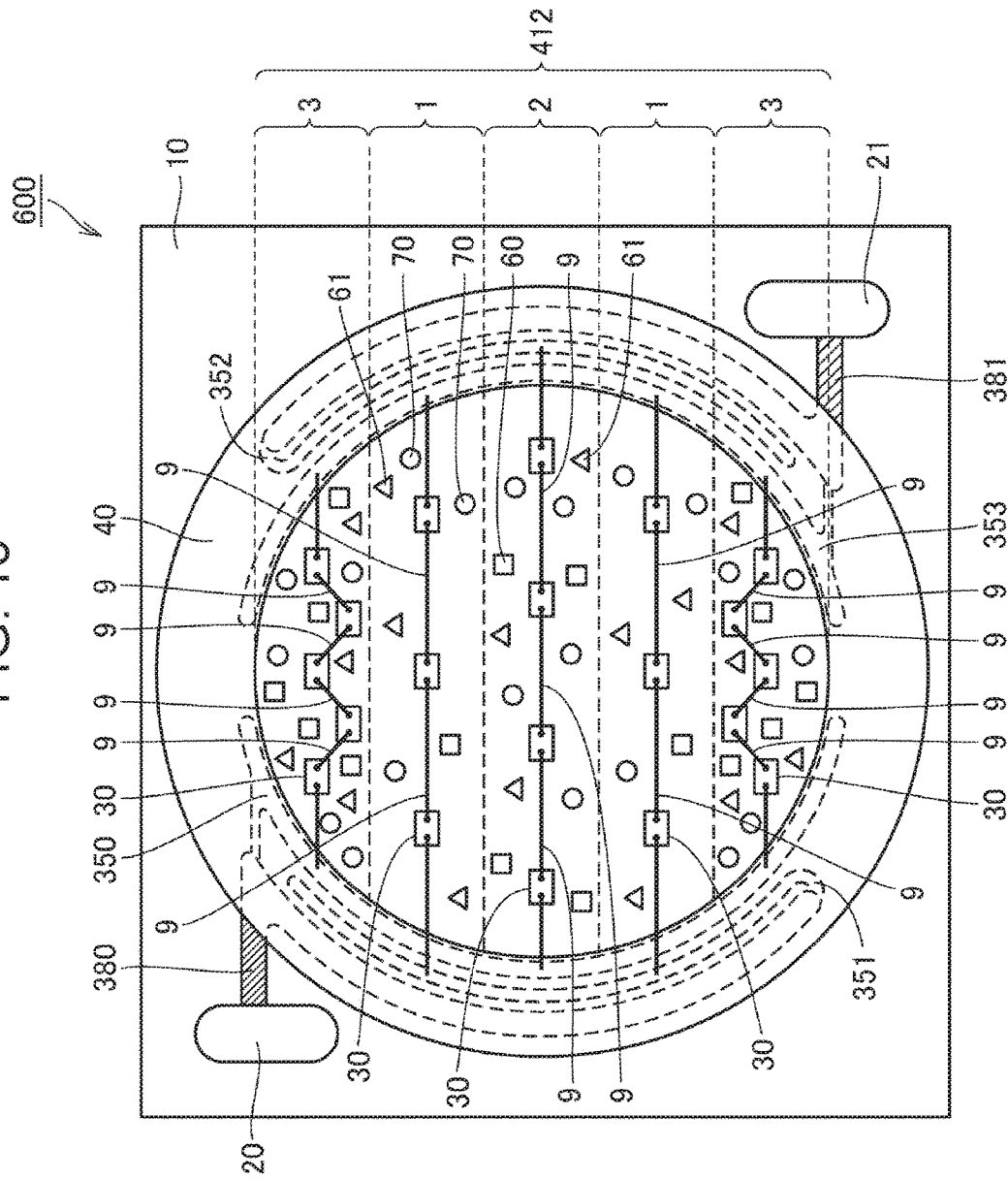
FIG. 15 is a schematic perspective view of the light-emitting device of FIG. 14.

FIG. 14 is a plan view of a modification of the light-emitting device according to Embodiment 5 of the invention and FIG. 15 is a schematic perspective view of the light-emitting device of FIG. 14.

In the present modification, a part of resistors 480 and 481 and all of wiring patterns 450, 451, 452, and 453 are covered with the resin dam 40. When the resistors and wiring patterns are covered with the resin dam 40, light absorbed by the resistor is able to be reduced and light emission efficiency of the light-emitting device is improved. It is preferable that all of the resistors and the wiring patterns are covered with the resin dam 40.

[Embodiment 6]

Figure 16:
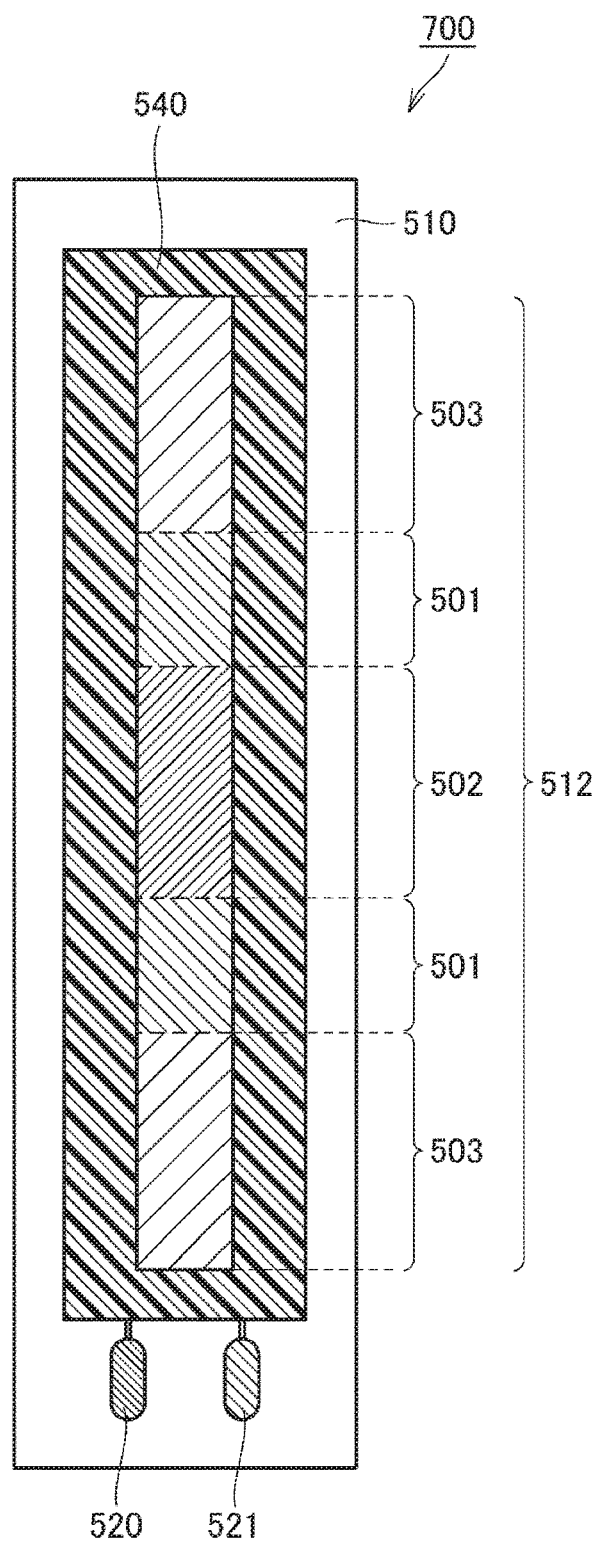
FIG. 16 is a plan view schematically illustrating a light-emitting device according to Embodiment 6 of the invention.
Figure 17:
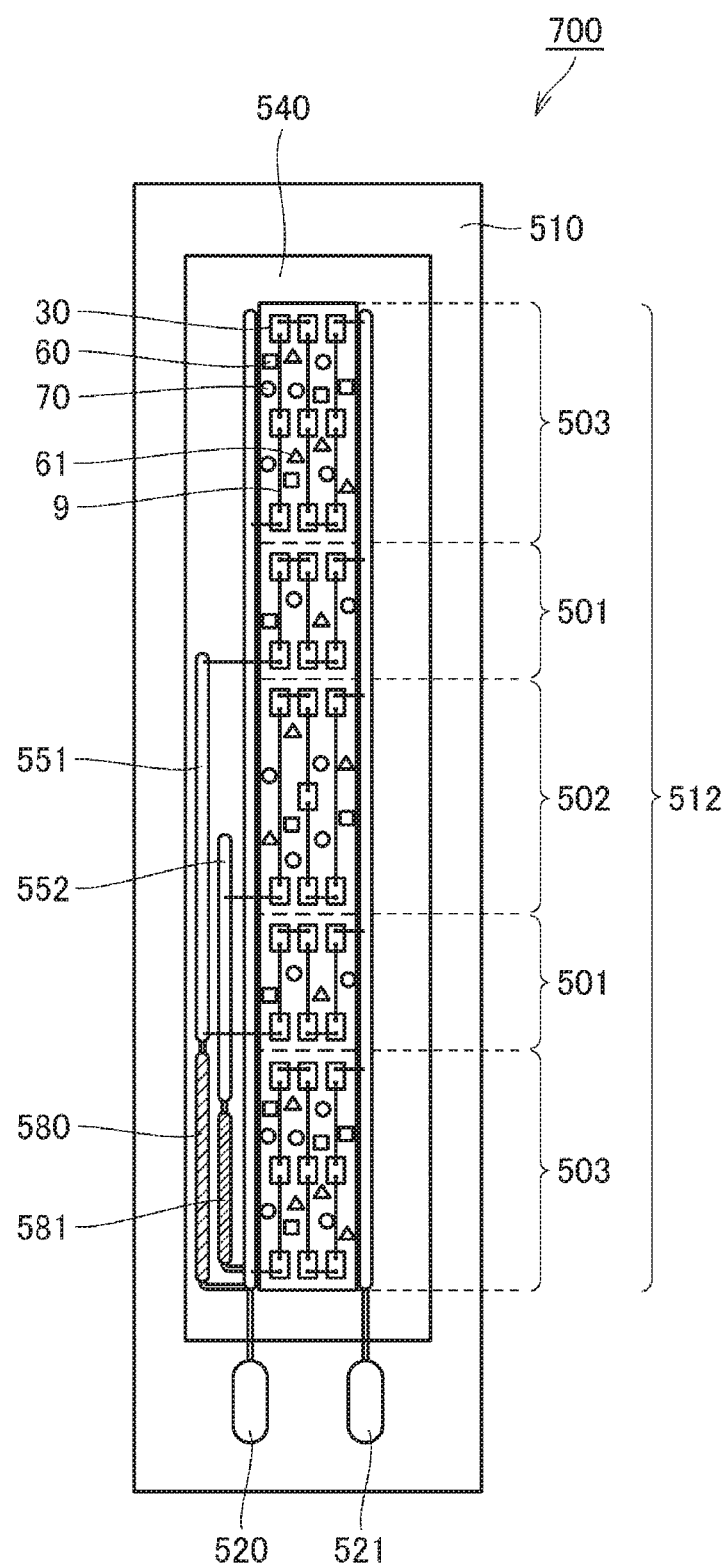
FIG. 17 is a schematic perspective view of the light-emitting device of FIG. 16.

FIG. 16 is a plan view schematically illustrating a light-emitting device according to Embodiment 6 of the invention and FIG. 17 is a schematic perspective view of the light-emitting device of FIG. 16.

A light-emitting device 700 according to the present embodiment has, as a basic constitution, a constitution similar to that of the light-emitting device 200 according to Embodiment 2. A difference from Embodiment 2 lies in that a shape of each of a first light-emitting portion 501, a second light-emitting portion 502, and a third light-emitting portion 503 is a rectangular shape when the light-emitting device is viewed from above and the whole light-emitting portion is in a rectangular shape when the light-emitting device is viewed from above, a resistor 580 and a resistor 581 are printed resistors and are covered with a resin dam 540, and no resistance monitor land is provided. When the resistor is covered with the resin dam 540, light absorbed by the resistor is able to be reduced and light emission efficiency of the light-emitting device is improved. It is preferable that all of the resistors and the wiring patterns are covered with the resin dam 540. In FIG. 16, the first light-emitting portion 501, the second light-emitting portion 502, and the third light-emitting portion 503 each have a rectangular shape and have short sides in contact with each other, but may have long sides in contact with each other.

FIG. 16 and FIG. 17 illustrate a light-emitting device in which the number of wires is three, but the number of the wires is not particularly limited as long as being three or more. For example, in a case where the number of the wires is four, the first light-emitting portion is connected to the first wire, the second light-emitting portion is connected to the second wire, the third light-emitting portion is connected to the third wire, and a fourth light-emitting portion is connected to a fourth wire. The number of the light-emitting portions connected in parallel may also be any number of one or more.

[Embodiment 7]

Figure 18:
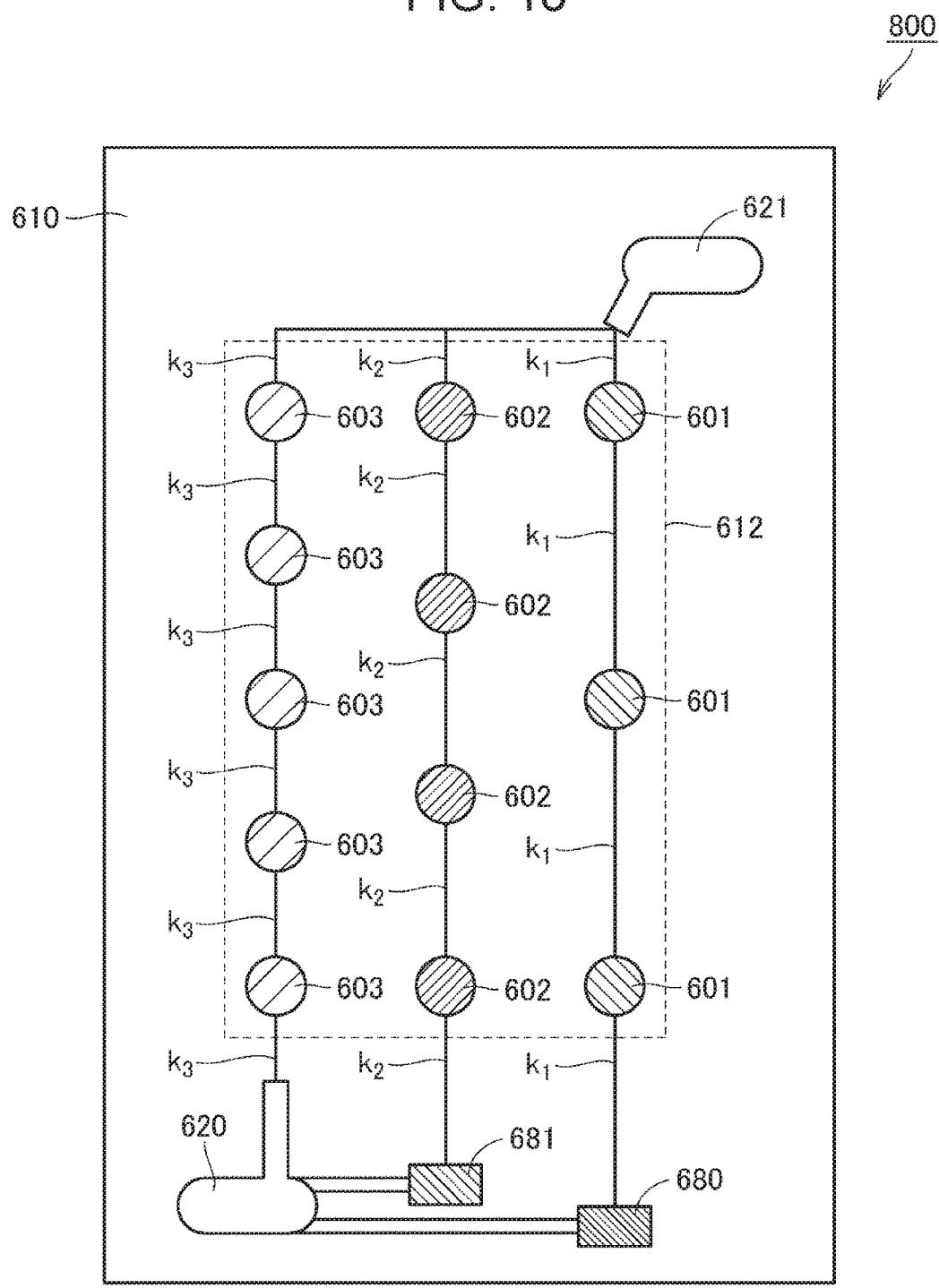
FIG. 18 is a plan view schematically illustrating a light-emitting device according to Embodiment 7 of the invention.
Figure 19:
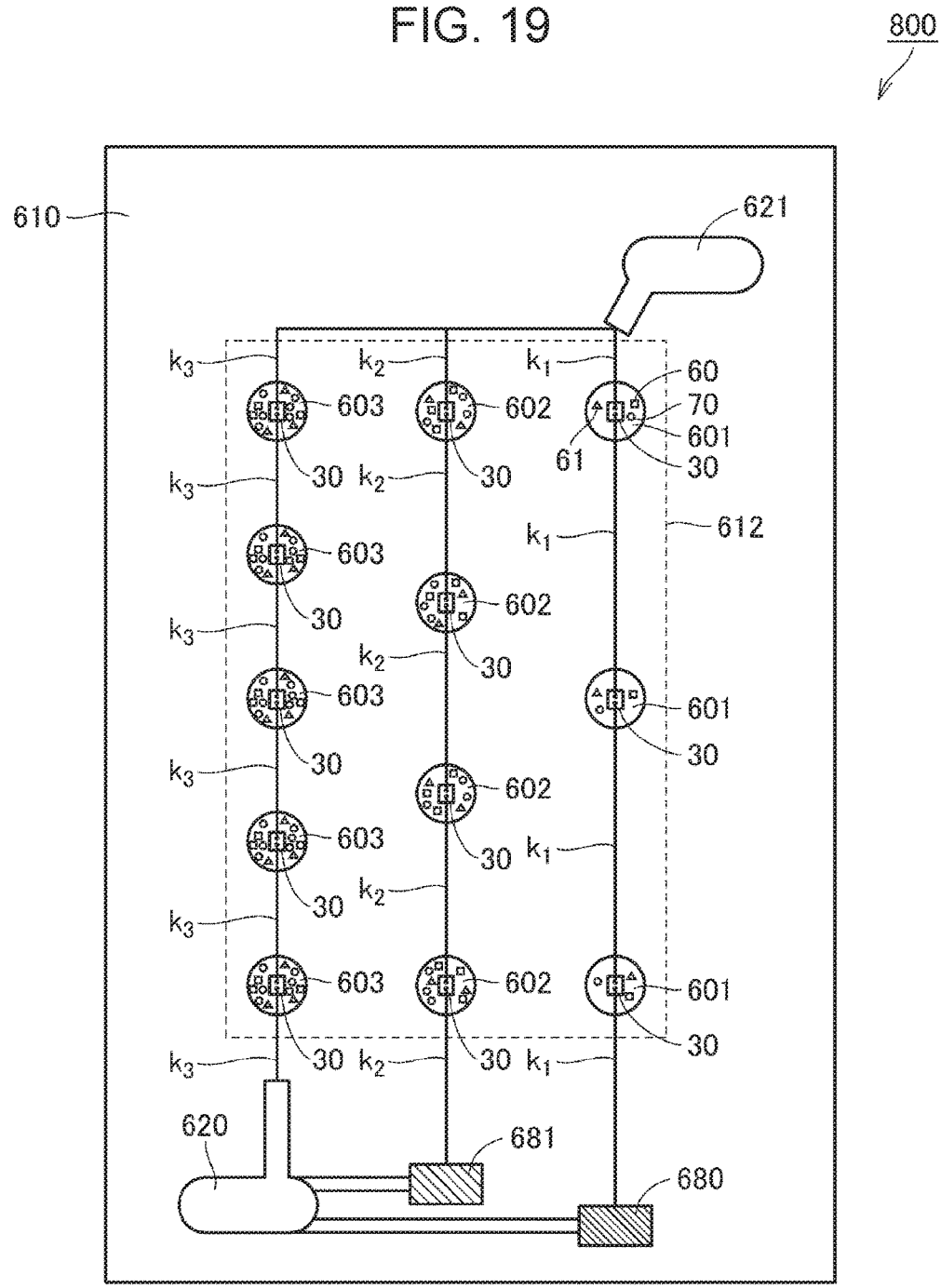
FIG. 19 is a schematic perspective view of the light-emitting device of FIG. 18.

FIG. 18 is a plan view schematically illustrating a light-emitting device according to Embodiment 7 of the invention and FIG. 19 is a schematic perspective view of the light-emitting device of FIG. 18.

A light-emitting device 800 according to the present embodiment has, as a basic constitution, a constitution similar to that of the light-emitting device according to Embodiment 1. A difference from Embodiment 1 lies in that three first light-emitting portions 601 are connected in series on the first wire $k_1$, four second light-emitting portions 602 are connected in series on the second wire $k_2$, five third light-emitting portions 603 are connected in series on the second wire $k_3$, the first light-emitting portion, the second light-emitting portion, and the third light-emitting portion are not adjacent to each other and are arranged at such a short distance from each other that light emitted from the first light-emitting portion, light emitted from the second light-emitting portion, and light emitted from the third light-emitting portion are fully mixed together, and one LED element is arranged inside each of the light-emitting portions.

Specifically, as illustrated in FIG. 18, the light-emitting device 800 includes, on a substrate 610, an anode electrode land 621, a cathode electrode land 620, and a first wire $k_1$, a second wire $k_2$, and a third wire $k_3$ by which the anode electrode land 621 and the cathode electrode land 620 are connected. A light-emitting portion 612 includes the three first light emitting portions 601 electrically connected in series on the first wire $k_1$, the four second light-emitting portions 602 electrically connected in series on the second wire $k_2$, and the five third light-emitting portions 603 electrically connected in series on the third wire $k_3$. A resistor 680 is connected to the first wire $k_1$ and a resistor 681 is connected to the second wire $k_2$.

The first light-emitting portion 601, the second light-emitting portion 602, and the third light-emitting portion 603 are arranged at such a short distance from each other that light emitted from the first light-emitting portion, light emitted from the second light-emitting portion, and light emitted from the third light-emitting portion are fully mixed together so that light emitted from the whole light-emitting device has a uniform color temperature. A distance between the first light-emitting portion and the second light-emitting portion and a distance between the second light-emitting portion and the third light-emitting portion are such that the shortest distance between outer edges of the light-emitting portions is preferably 28 mm or less, or more preferably, 22 mm or less. When the distance between the first light-emitting portion and the second light-emitting portion and the distance between the second light-emitting portion and the third light-emitting portion are 28 mm or less, light emitted from the first light-emitting portion and light emitted from the second light-emitting portion are able to be fully mixed together.

FIG. 18 and FIG. 19 illustrate a light-emitting device in which the number of wires is three, but the number of the wires is not particularly limited as long as being three or more. For example, in a case where the number of the wires is four, the first light-emitting portion is connected to the first wire, the second light-emitting portion is connected to the second wire, the third light-emitting portion is connected to the third wire, and a fourth light-emitting portion is connected to a fourth wire. The numbers of the light-emitting portions connected in series on the wires are not particularly limited, but are preferably all different from each other as illustrated in FIG. 18 and FIG. 19.

As illustrated in FIG. 19, each of a plurality of first light-emitting portions 601, a plurality of second light-emitting portions 602, and a plurality of third light-emitting portions 603 includes the red phosphors 60 and 61, the green phosphor 70, the LED element 30, and the transparent resin.

Figure 20:
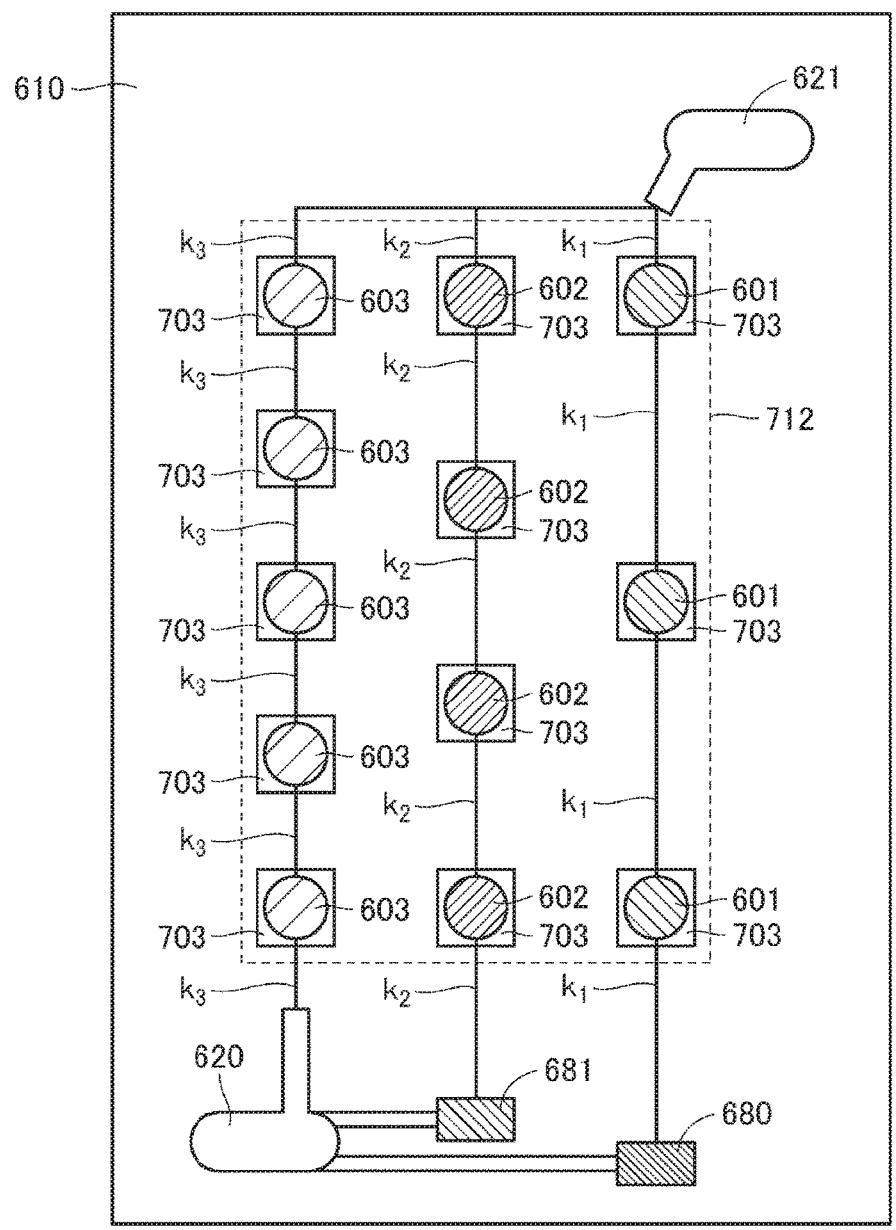
FIG. 20 is a plan view of a modification of the light-emitting device according to Embodiment 7 of the invention.
Figure 21:
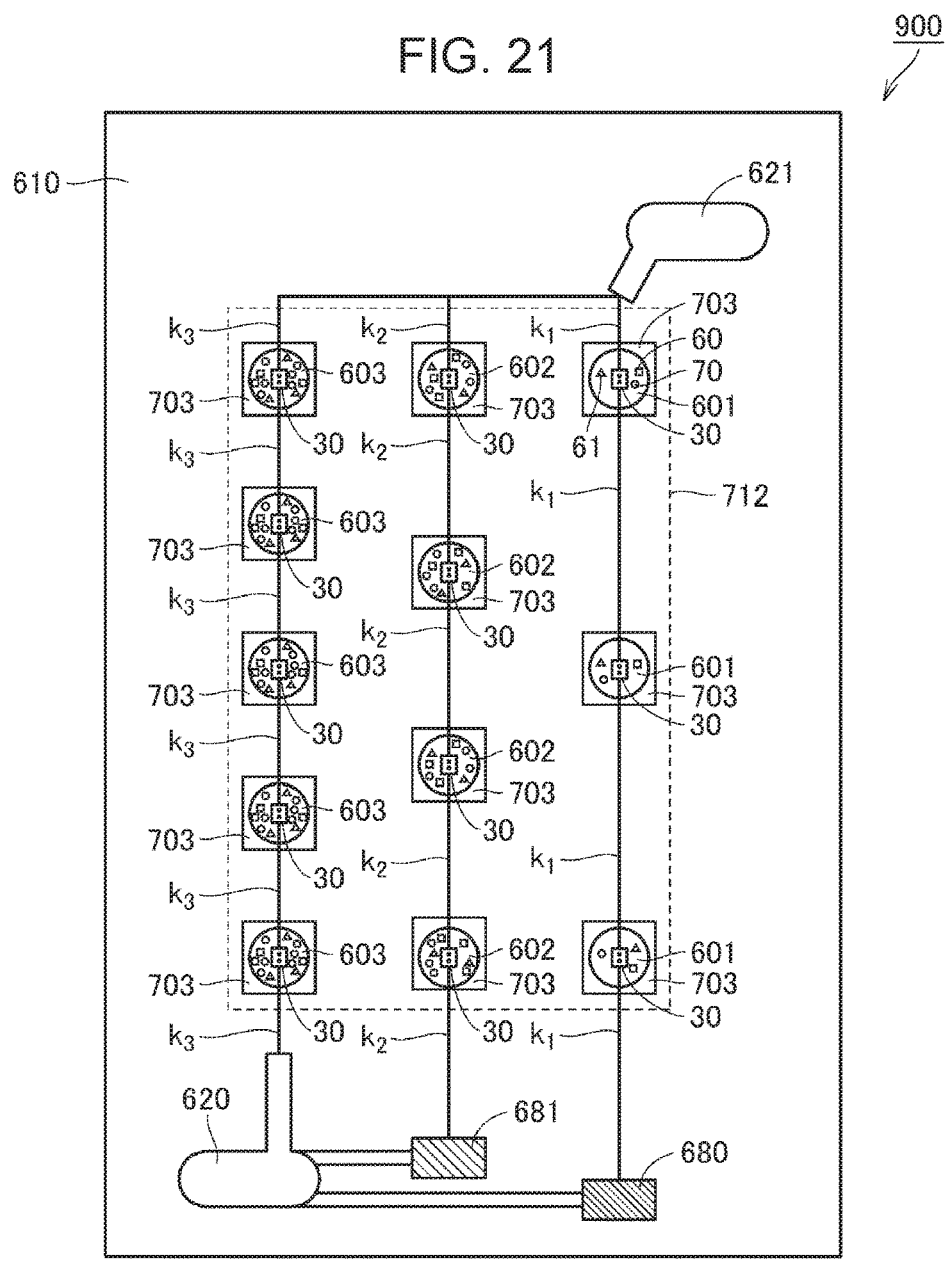
FIG. 21 is a schematic perspective view of the light-emitting device of FIG. 20.

FIG. 20 is a plan view of a modification of the light-emitting device according to Embodiment 7 of the invention and FIG. 20 is a schematic perspective view of the light-emitting device of FIG. 21.

Figure 22:
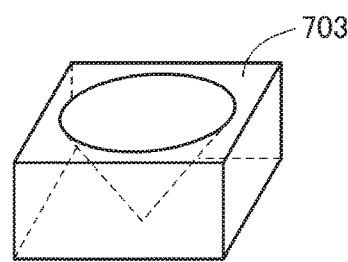
FIG. 22 is a schematic view illustrating an example of a reflector.

In a light-emitting device 900 of the present modification, the first light-emitting portion 601, the second light-emitting portion 602, and the third light-emitting portion 603 are each arranged inside a reflector 703. A shape of the reflector 703 is not particularly limited, and may be, for example, a shape obtained by hollowing out an inside part of a rectangular parallelepiped into a conical shape as illustrated in FIG. 22. Alternatively, a wall surrounding periphery of each of the first light-emitting portion 601, the second light-emitting portion 602, and the third light-emitting portion 603 is able to be formed instead of the reflector.

In the present modification, a distance between the first light-emitting portion and the second light-emitting portion and a distance between the second light-emitting portion and the third light-emitting portion are such that the shortest distance between outer edges of the light-emitting portions is preferably 28 mm or less, or more preferably, 22 mm or less. When the distance between the first light-emitting portion and the second light-emitting portion and the distance between the second light-emitting portion and the third light-emitting portion are 28 mm or less, light emitted from the first light-emitting portion, light emitted from the second light-emitting portion, and light emitted from the third light-emitting portion are able to be fully mixed together. Additionally, a beam angle of the LED element (values twice as large as an angle between a direction of luminous intensity half as high as the maximum luminous intensity of light exiting from the LED element and an optical axis) of each of the first light-emitting portion, the second light-emitting portion, and the third light-emitting portion is preferably 140° or less, more preferably, 120° or less. When the beam angle of the LED element is 140° or less, good brightness is able to be obtained.

[Embodiment 8]

Figure 23:
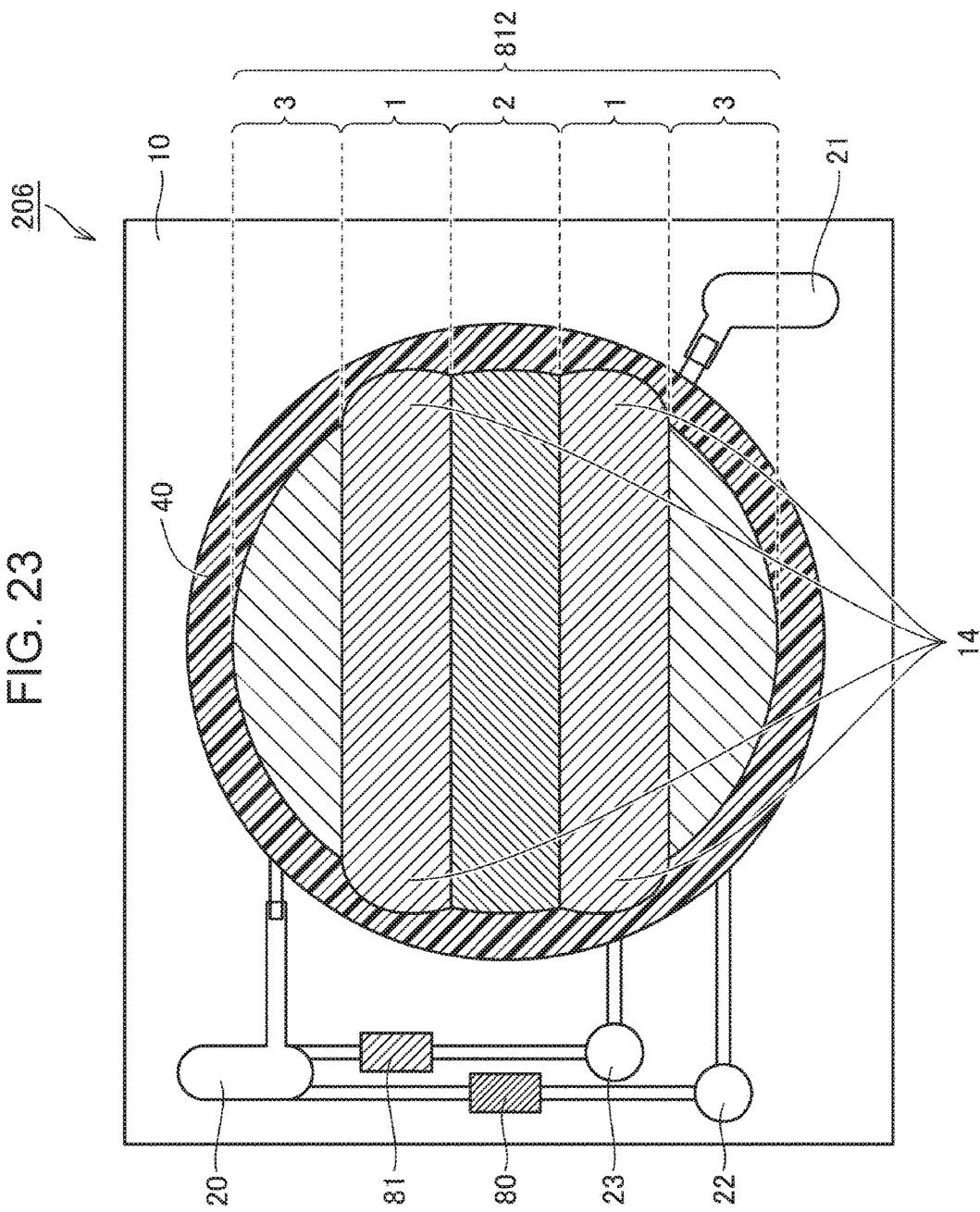
FIG. 23 is a plan view schematically illustrating a light-emitting device according to Embodiment 8 of the invention.

FIG. 23 is a plan view schematically illustrating a light-emitting device according to Embodiment 8 of the invention.

A light-emitting device 206 according to the present embodiment has, as a basic constitution, a constitution similar to that of the light-emitting device 200 according to Embodiment 2. A difference from Embodiment 2 lies in that the phosphor-containing transparent resin of the first light-emitting portion 1 covers a part of the resin dam 40 arranged around the light-emitting portion.

In a manufacturing process of the light-emitting device according to Embodiment 8, the resin dam 40 is formed and then the first light-emitting portions 1 are formed within the resin dam 40, and the phosphor-containing transparent resin which constitutes the second light-emitting portion 2 is injected into an area of a central portion of a light-emitting portion 12 surrounded by the resin dam 40 and the first light-emitting portions 1, so that the second light-emitting portion 2 is formed. The phosphor-containing transparent resin which constitutes the third light-emitting portion 3 is injected into two areas of ends of the light-emitting portion 12 surrounded by the resin dam 40 and each of the first light-emitting portions 1, so that the third light-emitting portions 3 are formed. For example, under circumstances where it is desirable that a width of the first light-emitting portion 1 is narrow in order to emit light having a low color temperature, the first light-emitting portion is needed to be formed as a drawing of a resin layer. This causes the resin to dribble at longitudinal ends 14 of the first light-emitting portions 1 and the longitudinal ends 14 have bulges as illustrated in FIG. 23.

When the first light-emitting portions 1 are formed within the resin dam 40 so that the longitudinal ends 14 of the first light-emitting portions 1 are formed to be positioned inside parts surrounded by the resin dam 40, subsequently, the injected areas of the second light-emitting portion 2 and the third light-emitting portion 3 are linked, and the phosphor-containing transparent resin which constitutes the second light-emitting portion 2 and the phosphor-containing transparent resin which constitutes the third light-emitting portion 3 are mixed during injection. Then, light emitted from the first light-emitting portion 1, light emitted from the second light-emitting portion 2, and light emitted from the third light-emitting portion 3 are not able to be fully mixed together and a color temperature of light emitted from the whole light-emitting device is not able to be a desired color temperate.

On the other hand, when the longitudinal ends 14 of the first light-emitting portions 1 are formed so as to partially cover the resin dam 40 as illustrated in FIG. 23, subsequently, the injected areas of the second light-emitting portion 2 and the third light-emitting portion 3 are not linked and the phosphor-containing transparent resin which constitutes the second light-emitting portion 2 and the phosphor-containing transparent resin which constitutes the third light-emitting portion 3 are not mixed during injection. Consequently, light emitted from the first light-emitting portion 1, light emitted from the second light-emitting portion 2, and light emitted from the third light-emitting portion 3 are able to be fully mixed together and the color temperature of light emitted from the whole light-emitting device is able to be a desired color temperate.

It is preferable that the longitudinal ends 14 of the first light-emitting portions 1 are positioned closer to an outer side than the center of a width of the resin dam 40. Thereby, boundary lines between the first light-emitting portions 1 and the second light-emitting portion 2 and boundary lines between the first light-emitting portions 1 and the third light-emitting portions 3 are able to be in contact with the resin dam while being kept substantially straight. This makes it possible to prevent the areas of the first light-emitting portions 1, the second light-emitting portion 2, and the third light-emitting portions 3 from being linked.

It is preferable that the longitudinal ends 14 of the first light-emitting portions 1 are formed on the resin dam 40. This makes it possible to prevent the first light-emitting portions 1 from partially or entirely covering the resistance monitor lands 22 and 23 or the resistors 80 and 81. When the first light-emitting portions 1 cover the resistance monitor land 22, resistance is not able to be measured. Additionally, when the first light-emitting portions 1 partially cover the resistors 80 and 81, the resistors 80 and 81 are not able to be notched by performing laser trimming to perform adjustment so that a desired resistance is achieved.

It is preferable that the first light-emitting portions 1 are greater in height than the second light-emitting portion 2 and the third light emitting portions 3. Thereby, when the resin dam 40 and the first light-emitting portions 1 are formed, and subsequently, the second light-emitting portion 2 and the third light-emitting portions 3 are injected, it is possible to prevent the second light-emitting portion 2 and the third light-emitting portions 3 from overriding the first light-emitting portions 1. This makes it possible to prevent and reduce the mixing of the phosphors included in the first light-emitting portions 1 and the phosphors included in the second light-emitting portion 2 and the third light-emitting portions 3.

In Embodiment 8, two first light-emitting portions 1, one second light-emitting portion, and two third light-emitting portions are formed, but the numbers of the first light-emitting portions 1, the second light-emitting portions 2, and the third light-emitting portions 3 are not limited thereto and may be one or more.

[Embodiment 9]

Figure 24:
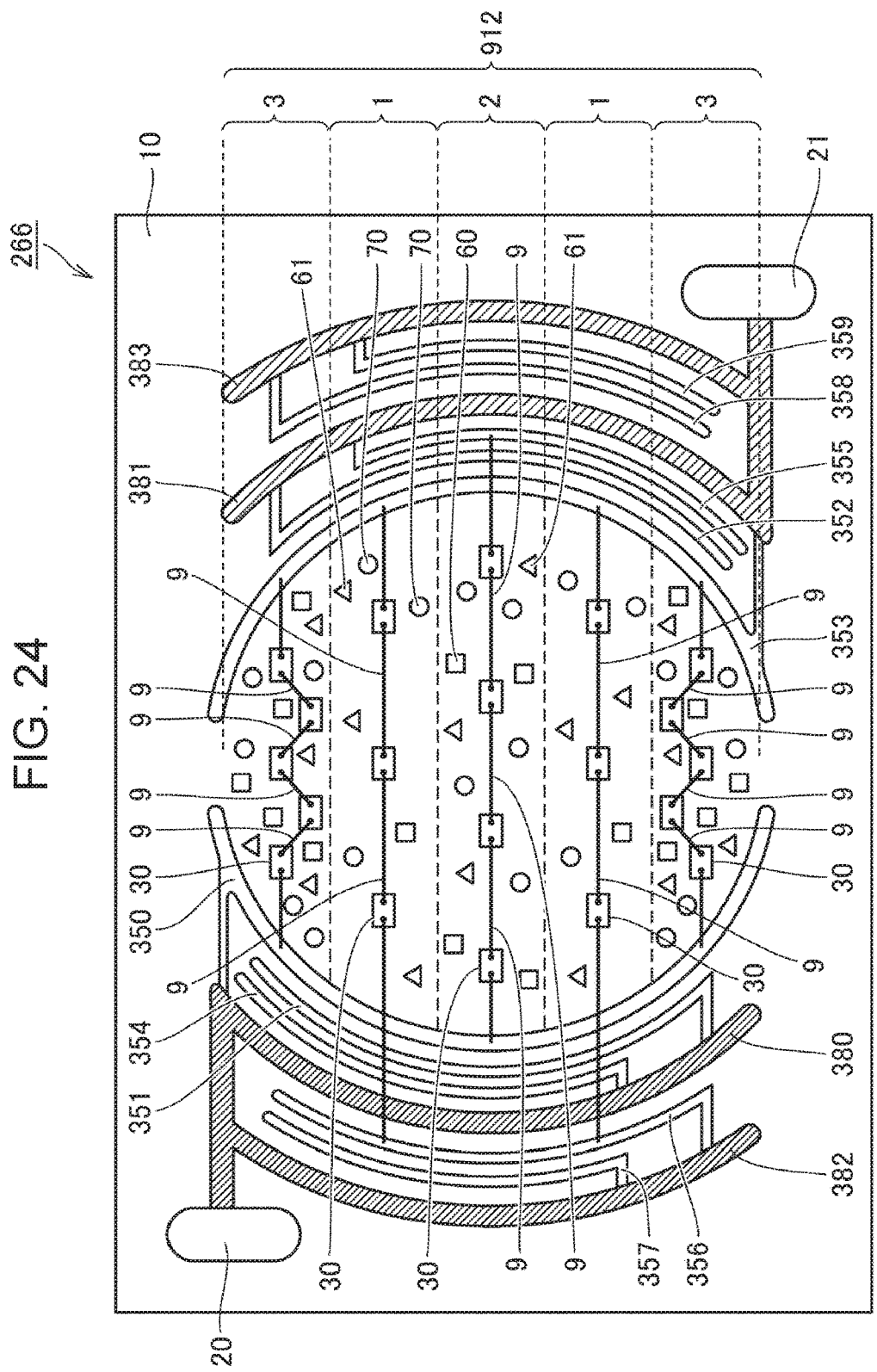
FIG. 24 is a schematic perspective plan view of a light-emitting device according to Embodiment 9 of the invention.

FIG. 24 is a schematic perspective plan view of a light-emitting device according to Embodiment 9 of the invention.

A light-emitting device 266 according to the present embodiment has, as a basic constitution, a constitution similar to that of the light-emitting device 500 according to Embodiment 5. A difference from Embodiment 5 lies in that a resistor 382 is connected to the cathode electrode land, a resistor 383 is arranged in the anode electrode land, three wiring patterns 350, 351, and 354 are connected to a resistor 380, three wiring patterns 352, 353, and 355 are connected to a resistor 381, two wiring patterns 356 and 357 are connected to the resistor 382, and two wiring patterns 358 and 359 are connected to the resistor 383.

The wiring patterns 350, 351, and 354 are connected to the same resistor 380, but the wiring patterns are connected to the resistor 380 at different positions. Accordingly, resistances of the resistor connected to the wiring patterns are different from each other. Also, the wiring patterns 352, 353, and 355 are connected to the resistor 381 at different positions, so that resistances of the resistor connected to wiring patterns are different from each other. Similarly, the wiring patterns 356 and 357 are connected to the resistor 382 at different positions, so that resistances of the resistor connected to the wiring patterns are different from each other. The wiring patterns 358 and 359 are also connected to the resistor 383 at different positions, so that resistances of the resistor connected to the wiring patterns are different from each other.

In the FIG. 24, the wires 9 by which the LED elements of the first light-emitting portion 1 are electrically connected to each other are connected to the wiring pattern 356 and the wiring pattern 353, the wires 9 by which the LED elements of the second light-emitting portion are electrically connected to each other are connected to the wiring pattern 350 and the wiring pattern 355, and the wires 9 by which the LED elements of the third light-emitting portion are electrically connected to each other are connected to the wiring pattern 350 and the wiring pattern 353. The wires 9 are able to be connected to any of the wiring patterns 350, 351, 352, 353, 354, 355, 356, 357, 358, and 359. It is preferable that each of the first light-emitting portions 1 is connected to any of the wiring patterns 351, 354, 356, and 357 on the cathode side and is connected to the wiring pattern 353 on the anode side. It is preferable that the second light-emitting portion 2 is connected to the wiring pattern 350 on the cathode side and is connected to any of the wiring patterns 352, 355, 358, and 359 on the anode side. It is preferable that each of the third light-emitting portions 3 is connected to the wiring pattern 350 on the cathode side and is connected to the wiring pattern 353 on the anode side.

Light-emitting devices using LED elements cause variation in chromaticity among the light-emitting devices due to variation in forward voltage (VF) values of the individual LED elements. Thus, for obtaining a fixed chromaticity, it is necessary to change a mixing ratio of phosphors to transparent resin which are included in a light-emitting portion in accordance with each of the VF values of the LED elements, so that management of mixing conditions and management of the chromaticity are complicated. On the other hand, the chromaticity of each of the light-emitting devices also varies due to a resistance of a resistor connected to a wiring pattern to which the LED elements are connected. Accordingly, by selecting the resistance of the resistor connected to the wiring pattern to be connected in accordance with the VF values of the LED elements, it is possible to reduce influence of the variation in the VF values on the chromaticity of the light-emitting device. That is, the light-emitting device according to the present embodiment is able to obtain a desired chromaticity by selecting, as a connecting destination of the LED elements, the wiring pattern connected to the resistor having an optimum resistance while keeping the mixing ratio of the phosphors to a transparent resin. Accordingly, the light-emitting device according to the present embodiment is able to reduce the variation in the chromaticity among the light-emitting devices.

[Embodiment 10]

Figure 25:
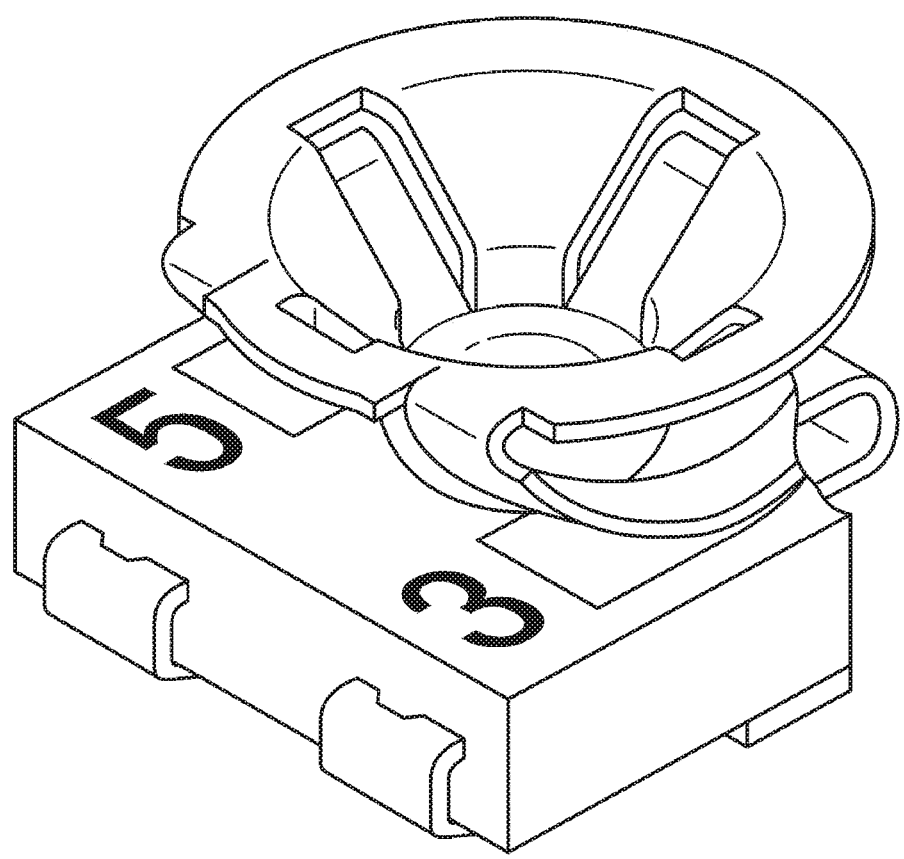
FIG. 25 is a schematic view illustrating an example of a variable resistor.

A light-emitting device according to Embodiment 10 has, as a basic constitution, a constitution similar to that of the light-emitting device according to Embodiment 1. A difference from Embodiment 1 lies in that a variable resistor is used as the resistor. When the variable resistor is used, a resistance is able to be changed even after the light-emitting device is assembled, so that current input to the light-emitting device is able to be controlled. Accordingly, the variation in the color temperature among the light-emitting devices is able to be controlled. Furthermore, the color temperature is able to be adjusted by a user. A type of the variable resistor is not limited in particular and a variable resistor of a volume type illustrated in FIG. 25 may be used, for example.

[Embodiment 11]

A light-emitting device according to Embodiment 11 has, as a basic constitution, a constitution similar to that of the light-emitting device according to Embodiment 1. A difference from Embodiment 1 lies in that a thermistor is used as the resistor.

The thermistor is a temperature-sensitive resistor whose resistance is changed in accordance with a change in temperature of an ambient environment. As the thermistor, there is a PTC (Positive Temperature Coefficient) thermistor whose resistance is logarithmically increased at a temperature higher than a certain fixed temperature (Curie point) or an NTC (Negative Temperature Coefficient) thermistor whose resistance is logarithmically decreased from low temperature to high temperature. When the current input to the light-emitting device is changed, an amount of heat generated by the light-emitting portion is changed and a temperature of a substrate is also changed. Accordingly, in a case where the thermistor is used as the resistor, when the temperature of an ambient environment around the thermistor is changed by changing the input current, the resistance of the thermistor is changed. As a result, by changing the input current, the color temperature of light emitted from the whole light-emitting device is able to be controlled. Note that, as the NTC thermistor has the resistance moderately changed in response to a change in temperature, it is preferable that the NTC thermistor is used in the present embodiment.

[Conclusion of Embodiments]

A light-emitting device according an embodiment of the invention includes an anode electrode land, a cathode electrode land, three or more wires that are provided in parallel and are connected to the anode electrode land and the cathode electrode land, in which the three or more wires have different forward current-forward voltage characteristics and the three or more wires are connected to different light-emitting portions, and a color temperature of light emitted from the whole of the light-emitting portions is able to be adjusted.

In the light-emitting device according to an embodiment of the invention, it is preferable that each of light-emitting portions connected to each of the three or more wires is arranged such that light emitted from any of the light-emitting portions is able to be mixed with light from the rest of the light-emitting portions. Consequently, light emitted from any of the light-emitting portions is uniformly mixed with light emitted from the rest of the light light-emitting portions so that the light-emitting device is able to emit light with a more uniform color temperature.

In the light-emitting device according to an embodiment of the invention, it is preferable that each of the light-emitting portions includes at least two kinds of phosphors and contents of the phosphors included in the light-emitting portions are all different from each other. Consequently, the color temperature of light emitted from each of the light-emitting portions is able to be adjusted to be different color temperature. It is preferable that each of the light-emitting portions includes an LED element, transparent resin, and at least two kinds of phosphors. The light-emitting device of the present embodiment uses the LED element as a light source, and thus is able to have long operating time and suppress heat generation during lighting. Furthermore, since the light-emitting portion includes at least two kinds of phosphors, the color temperature of the light emitted from the light-emitting portion is able to be adjusted by changing the types and amount of the phosphors that are blended. Additionally, the phosphors included in the light-emitting portion are able to efficiently absorb light emitted from the LED element so that light emission efficiency is able to be improved.

In the light-emitting device according to an embodiment of the invention, it is preferable that resistors are connected to at least two wires among the three or more wires and it is more preferable that resistors are connected to all the wires. Additionally, resistances of the resistors connected to the wires may be equal or may be different, but may be preferably all different. The color temperature of light emitted from the whole light-emitting portion is able to be adjusted by changing the resistances of the resistors connected to the wires.

It is preferable that the resistor includes a chip resistor or a printed resistor. Consequently, adjustment of the resistance is easily performed.

It is preferable that the resistor is covered with phosphor-containing transparent resin which forms the light-emitting portion or colored resin. Consequently, the light absorbed by the resistor is able to be reduced.

It is preferable that a wire, which is connected to the resistor, among the three or more wires includes a resistance monitor. Consequently, the resistance is able to be measured correctly and the color temperature of the light emitted from the light-emitting portion is able to be easily adjusted.

It is preferable that the numbers of series-connected LED elements included in the light-emitting portions are all different from each other. In a case the resistances of the resistors connected to the wires and the numbers of the series-connected LED elements included in the light-emitting portions connected to the wires are different among the wires, when a constant current flows through the light-emitting device, different voltages are able to be obtained in the wires.

In the light-emitting device according to an embodiment of the invention, it is preferable that one or more light-emitting portions are connected in series with each of the three or more wires and the numbers of light-emitting portions connected in series to each of the three or more wires are all different. According to the light-emitting device of the present embodiment, the color temperature of light emitted from the whole of the light-emitting portions is able to be adjusted by power supplied from a single power source.

It is preferable that a protective device may be connected in parallel with at least any of the three or more wires. Consequently, it is possible to prevent a wiring circuit from being damaged at the time of overcurrent conduction.

It is preferable that a resin dam is formed surrounding the whole of the light-emitting portions. Consequently, the light-emitting portions each including the transparent resin are able to be retained in the resin dam.

It is preferable that the resistor is arranged outside the resin dam. Consequently, the light absorbed by the resistor is able to be reduced.

It is preferable that the resistor is covered with the resin dam. Consequently, the light absorbed by the resistor is able to be reduced.

It is preferable that at least a part of the three or more wires is covered with the resin dam. Consequently, the light absorbed by the wires is able to be reduced. Additionally, the wires are able to be protected from external stress.

The invention is not limited to embodiments described above, and may be modified in various manners within the scope indicated in claims, and an embodiment achieved by appropriately combining techniques which are disclosed in different embodiments is also encompassed in the technical scope of the invention.

EXAMPLES

The invention will be more specifically described with Examples. Note that, the invention is not limited by Examples.

Example 1

In Example 1, a test was carried out by using a light-emitting device having a constitution similar to that of Embodiment 2.

A ceramic substrate was used as a substrate. Both a resistor connected to a first wire and a resistor connected to a second wire were chip resistors each having a resistance of 50Ω.

A first red phosphor ($CaAlSiN_3$:Eu), a second red phosphor (($Sr,Ca$)$AlSiN_3$:Eu), a green phosphor ($Lu_3Al_5O_{12}$:Ce), and blue light emitting LED elements (emission wavelength of 450 nm) were sealed with silicone resin in each of the first light-emitting portion, the second light-emitting portion, and the third light-emitting portion. The blue light emitting LED elements and wiring patterns were electrically connected by wires, and the wiring patterns were electrically connected to the electrode land.

The light-emitting device of Example 1 was formed such that the color temperature of light emitted from the first light-emitting portion was 1500 K, the color temperature of light emitted from the second light-emitting portion was 3660 K, and the color temperature of light emitted from the third light-emitting portion was 5000 K.

Figure 26:
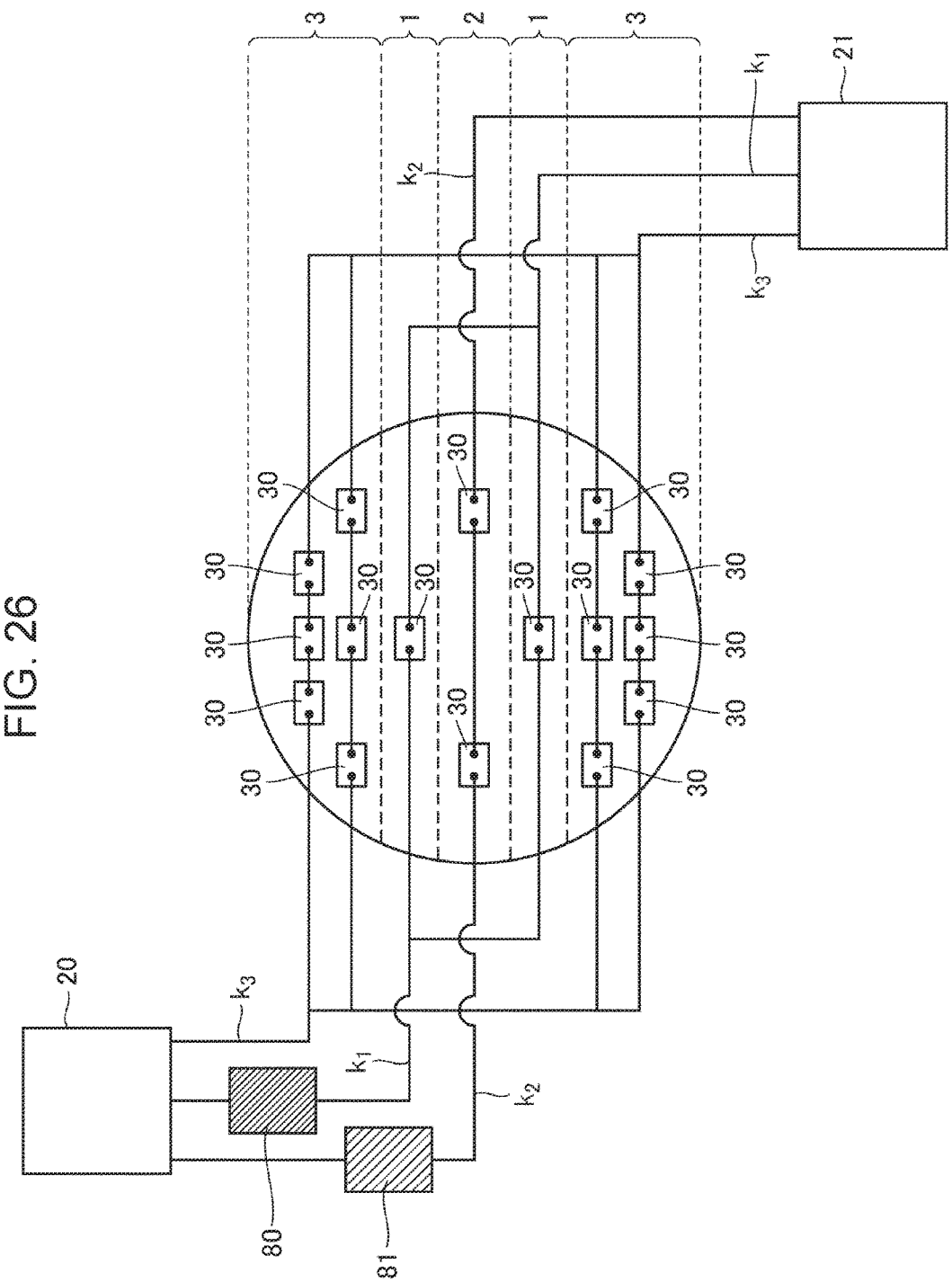
FIG. 26 is a view schematically illustrating arrangement of LED elements in Example 1.

FIG. 26 is a view schematically illustrating arrangement of the blue light emitting LED elements in the light-emitting device of Example 1. In the light-emitting device of Example 1, one LED element 30 is arranged in each of two first light-emitting portions 1, two LED elements 30 are connected in series and are arranged in one second light-emitting portion 2, two wires to each of which three LED elements 30 are connected in series are arranged in parallel in each of two third light-emitting portions 3. Conditions of Example 1 are indicated in Table 1.

TABLE 1

| Example | Wire | Light-emitting portion | Resistance of resistor | Color temperature | Blue light emitting LED element | | |
|---|---|---|---|---|---|---|---|
| | | | | | Series-connected number | Parallel-connected number | Number of light-emitting portions |
| 1 | First wire | First light-emitting portion | 50Ω | 1500 K | 1 | 1 | 2 |
| | Second wire | Second light-emitting portion | 50Ω | 3660 K | 2 | 1 | 1 |
| | Third wire | Third light-emitting portion | None | 5000 K | 3 | 2 | 2 |
| 2 | First wire | First light-emitting portion | 50Ω | 1500 K | 1 | 1 | 2 |
| | Second wire | Second light-emitting portion | 50Ω | 3825 K | 2 | 1 | 1 |
| | Third wire | Third light-emitting portion | None | 6980 K | 3 | 2 | 2 |
| 3 | First wire | First light-emitting portion | 50Ω | 1630 K | 1 | 1 | 2 |
| | Second wire | Second light-emitting portion | 50Ω | 4570 K | 2 | 1 | 1 |
| | Third wire | Third light-emitting portion | None | 6980 K | 3 | 2 | 2 |

Figure 27:
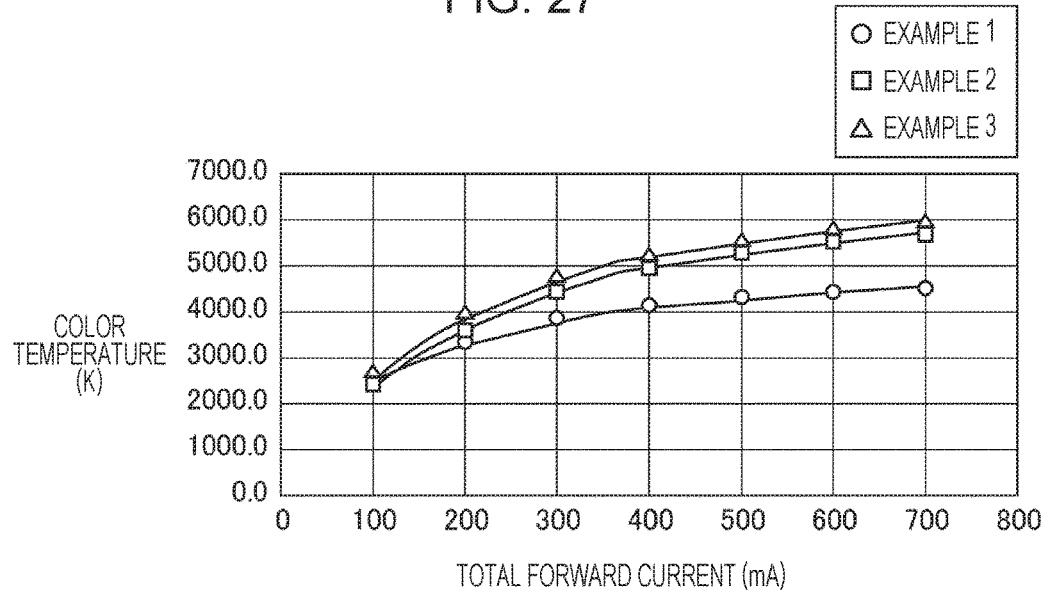
FIG. 27 is a graph indicating a relation between a total forward current and a color temperature in the light-emitting devices of Examples 1 to 3.

A relation between the magnitude of a total of forward currents (hereinafter, also referred to as a total forward current) flowing through the first wire, the second wire, and the third wire and a color temperature of light emitted from each of the light-emitting devices was examined. The results are indicated in FIG. 27.

When current of the total forward current of 100 mA flowed, the color temperature of light emitted from the whole light-emitting device was 2410 K, and when current of the total forward current of 700 mA flowed, the color temperature of light emitted from the whole light-emitting device was 4500 K.

Figure 28:
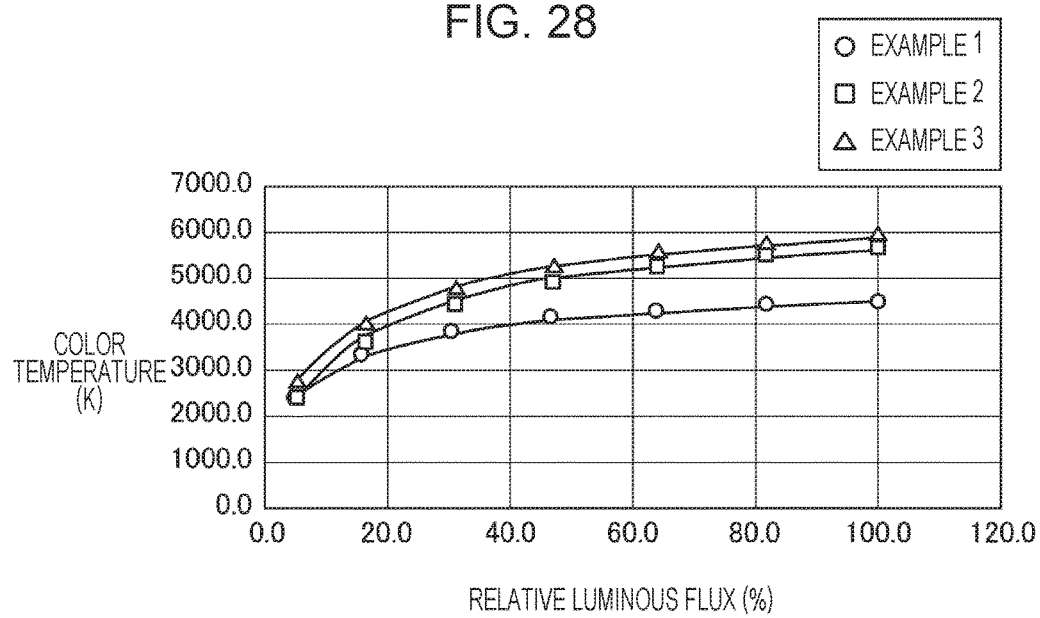
FIG. 28 is a graph indicating a relation between a relative luminous flux and a color temperature in the light-emitting devices of Examples 1 to 3.

FIG. 28 is a graph indicating a relation between relative luminous flux of light (%) and the color temperature when the total forward current is changed with the luminous flux of light emitted from the whole light-emitting device at the time of the total forward current of 700 mA as 100%. FIG. 28 indicates that when the relative luminous flux is reduced, the color temperature becomes low. FIG. 28 indicates that when the current flowing through the light-emitting portion is continuously changed, the luminous flux of the light emitted from the light-emitting portion is also continuously changed, and the color temperature of light emitted from the whole light-emitting device is low in an area where a current value is small, the color temperature of light emitted from the whole light-emitting device is continuously increased as the current value is increased, and the color temperature of light emitted from the whole light-emitting device becomes high in an area where the current value is large.

Figure 30:
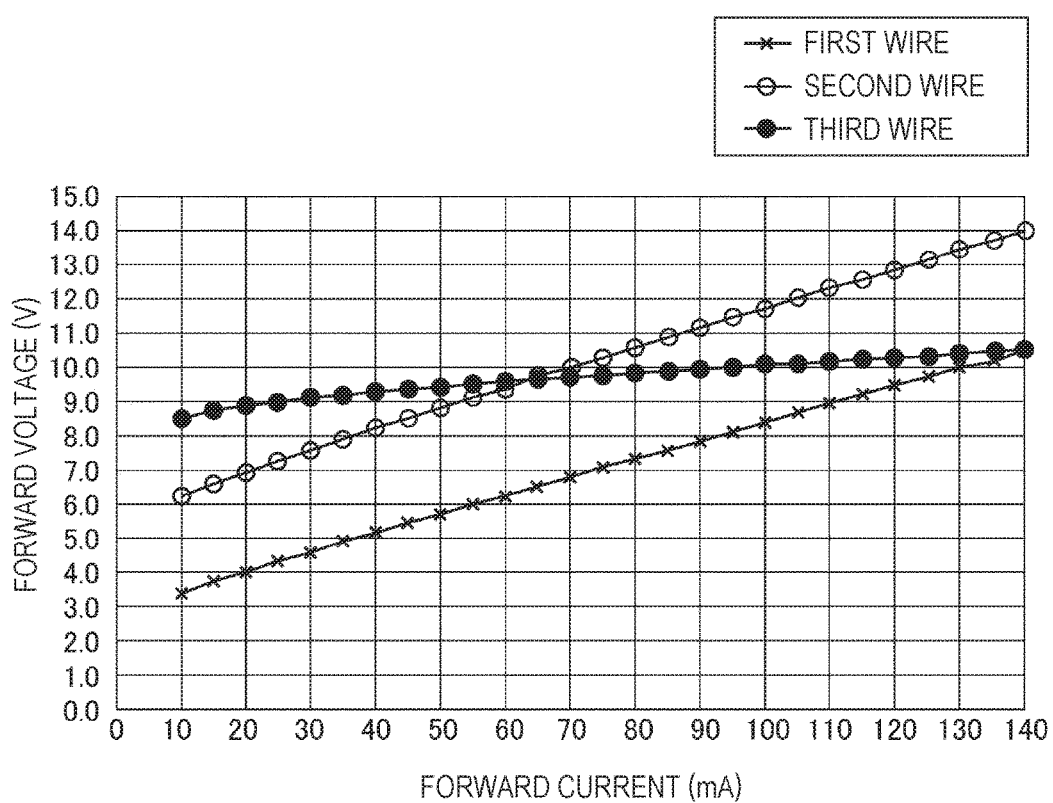
FIG. 30 is a view illustrating forward current-forward voltage characteristics of each of wires in Example 1.

A change in a value of the forward voltage with respect to a change in a value of the forward current (forward current-forward voltage characteristics) was measured in each of the first wire, the second wire, and the third wire. The results are indicated in FIG. 30. FIG. 30 indicates that the first wire, the second wire, and the third wire have different forward current-forward voltage characteristics.

Example 2

In Example 2, a test was carried out by using a light-emitting device having a constitution similar to that of Embodiment 2.

The ceramic substrate was used as a substrate. Both a resistor connected to the first wire and a resistor connected to the second wire were chip resistors each having the resistance of 50Ω.

The first red phosphor ($CaAlSiN_3$:Eu), the second red phosphor (($Sr,Ca)AlSiN_3$:Eu), the green phosphor ($Lu_3Al_5O_{12}$:Ce), and the blue light emitting LED elements (emission wavelength of 450 nm) were sealed with the silicone resin in the first light-emitting portion, the second light-emitting portion, and the third light-emitting portion. The blue light emitting LED elements and the wiring patterns were electrically connected by the wires, and the wiring patterns were electrically connected to the electrode land.

The light-emitting device of Example 2 was formed such that the color temperature of light emitted from the first light-emitting portion was 1500 K, the color temperature of light emitted from the second light-emitting portion was 3825 K, and the color temperature of light emitted from the third light-emitting portion was 6980 K. The number and the arrangement of the LED elements in each of the light-emitting portions were similar to those of Example 1. Conditions of Example 2 are indicated in Table 1

A relation between the magnitude of a total of forward currents (hereinafter, also referred to as a total forward current) flowing through the first wire, the second wire, and the third wire and a color temperature of light emitted from each of the light-emitting devices is examined. The results are indicated in FIG. 27.

When current of the total forward current of 100 mA flowed, the color temperature of light emitted from the whole light-emitting device was 2410 K, and when current of the total forward current of 700 mA flowed, the color temperature of light emitted from the whole light-emitting device was 5690 K.

FIG. 28 is a graph indicating a relation between relative luminous flux of light (%) and the color temperature when the total forward current is changed with the luminous flux of light emitted from the whole light-emitting device at the time of the total forward current of 700 mA as 100%. FIG. 28 indicates that when the relative luminous flux is reduced, the color temperature becomes low.

Example 3

In Example 3, a test was carried out by using a light-emitting device having a constitution similar to that of Embodiment 2.

The ceramic substrate was used as a substrate. Both a resistor connected to the first wire and a resistor connected to the second wire were chip resistors each having the resistance of 50Ω.

The first red phosphor ($CaAlSiN_3$:Eu), the second red phosphor (($Sr,Ca)AlSiN_3$:Eu), the green phosphor ($Lu_3Al_5O_{12}$:Ce), and the blue light emitting LED elements (emission wavelength of 450 nm) were sealed with the silicone resin in the first light-emitting portion, the second light-emitting portion, and the third light-emitting portion. The blue light emitting LED elements and the wiring patterns were electrically connected by the wires, and the wiring patterns were electrically connected to the electrode land.

The light-emitting device of Example 3 was formed such that the color temperature of light emitted from the first light-emitting portion was 1630 K, the color temperature of light emitted from the second light-emitting portion was 4570 K, and the color temperature of light emitted from the third light-emitting portion was 6980 K. The number and the arrangement of the LED elements in each of the light-emitting portions were similar to those of Example 1. Conditions of Example 3 are indicated in Table 1

A relation between the magnitude of a total of forward currents (hereinafter, also referred to as a total forward current) flowing through the first wire, the second wire, and the third wire and a color temperature of light emitted from each of the light-emitting devices was examined. The results are indicated in FIG. 27.

When current of the total forward current of 100 mA flowed, the color temperature of light emitted from the whole light-emitting device was 2730 K, and when current of the total forward current of 700 mA flowed, the color temperature of light emitted from the whole light-emitting device was 5931 K.

FIG. 28 is a graph indicating a relation between relative luminous flux of light (%) and the color temperature when the total forward current is changed with the luminous flux of light emitted from the whole light-emitting device at the time of the total forward current of 700 mA as 100%. FIG. 28 indicates that when the relative luminous flux is reduced, the color temperature becomes low.

Figure 29:
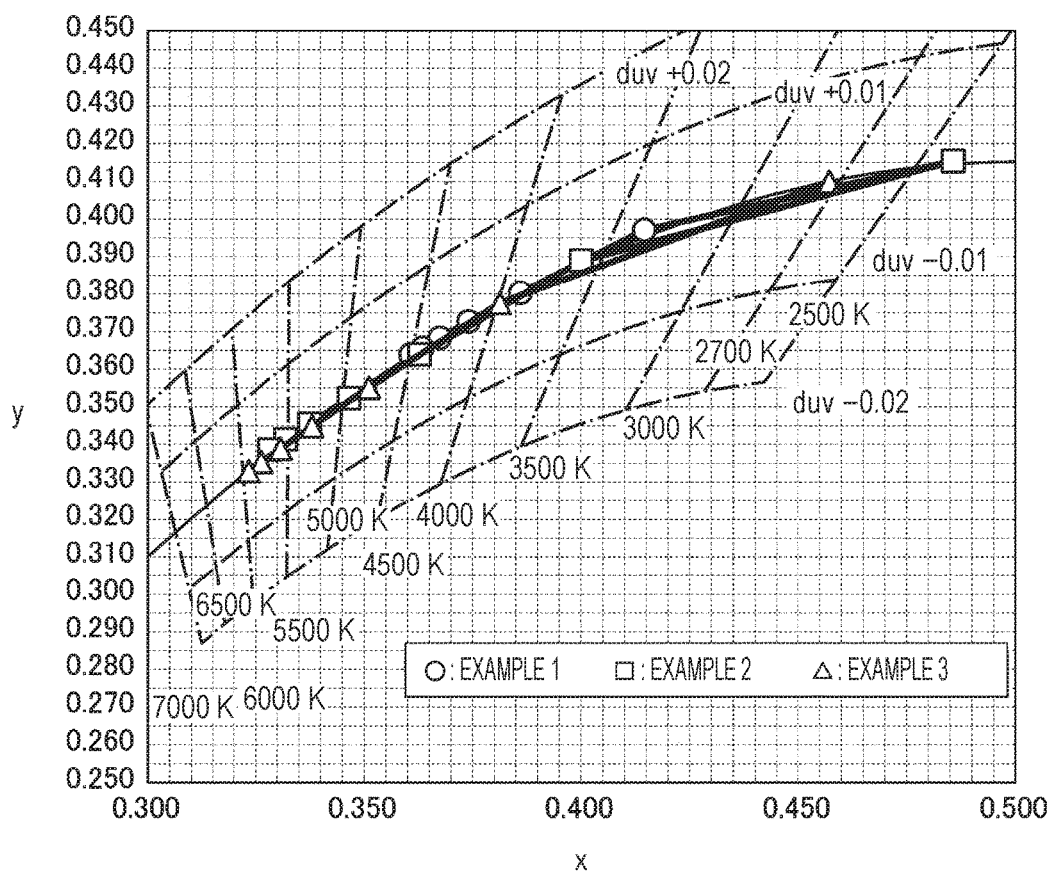
FIG. 29 is a view plotting results of Examples 1 to 3 on chromaticity coordinates.

Results obtained by comparing results of Example 1, Example 2, and Example 3 that are plotted on chromaticity coordinates with a locus of blackbody radiation are indicated in FIG. 29. Each of the color temperatures in all of Example 1, Example 2, and Example 3 changes with a curve along the locus of the blackbody radiation on the chromaticity coordinates.

It is to be considered that the embodiments and Examples which are disclosed herein are illustrative and non-restrictive in every respect. The scope of the invention is indicated by the claims, not by the embodiments described above, and is intended to include all modifications within the scope and meaning equivalent to the claims.

REFERENCE SIGNS LIST 1, 501, 601 first light-emitting portion
2, 502, 602 second light-emitting portion
3, 503, 603 third light-emitting portion
12, 112, 212, 312, 412, 512, 612, 712, 812, 912 light-emitting portion
14 longitudinal end
6, 100, 200, 206, 266, 300, 400, 500, 600, 700, 800, 900 light-emitting device
10, 510, 610 substrate
20, 520, 620 cathode electrode land
21, 521, 621 anode electrode land
22, 23 resistance monitor land
LED element
40, 540 resin dam
50, 51, 52, 53, 251, 253, 350, 351, 352, 353, 354, 450, 451, 452, 453 wiring pattern
60 first red phosphor
61 second red phosphor
70 green phosphor
80, 81, 280, 281, 380, 381, 680, 681 resistor
9 wire
703 reflector
$k_1$ first wire
$k_2$ second wire
$k_3$ third wire

The invention claimed is:
1. A light-emitting device comprising:
an anode electrode land;
a cathode electrode land;
a light-emitting portion including at least a first light-emitting portion, a second light-emitting portion, and a third light-emitting portion; and
three or more wires that are provided in parallel and are connected to the anode electrode land and the cathode electrode land, wherein
the three or more wires include a first wire, a second wire, and a third wire,
the first light-emitting portion includes an LED element connected in series on the first wire,
the second light-emitting portion includes an LED element connected in series on the second wire,
the third light-emitting portion includes an LED element connected in series on the third wire,
the first light-emitting portion, the second light-emitting portion, and the third light-emitting portion each emit light having a different color temperature,
each of at least the first wire and the second wire among the three or more wires has a fixed resistor arranged outside the light-emitting portion,
a resistance of the fixed resistor arranged in the first wire is equal to or smaller than a resistance of the fixed resistor arranged in the second wire,
at least the first wire, the second wire, and the third wire among the three or more wires have different forward current-forward voltage characteristics and are respectively connected to the first light-emitting portion, the second light-emitting portion, and the third light-emitting portion, and
a color temperature of light emitted from a whole of the light-emitting portion is able to be adjusted, wherein
the light-emitting device further comprises a substrate,
the substrate comprises a front surface and a back surface facing to the front surface, and
the first light-emitting portion, the second light-emitting portion, the third light-emitting portion, the fixed resistor connected to the first wire, and the fixed resistor connected to the second wire are arranged on the front surface of the substrate,
wherein the anode electrode land and the cathode electrode land are the only anode electrode land and cathode electrode land, respectively, included in the light emitting device for externally applying current thereto, total current applied to the light-emitting device is branched into at least the first light-emitting portion, the second light-emitting portion, and the third light-emitting portion arranged in parallel on the circuit in the light-emitting device, each of at least the first light-emitting portion, the second light-emitting portion, and the third light-emitting portion has a response characteristic in which an amount of current applied to each light-emitting portion, in response to a total amount of current applied to the light-emitting device, varies depending on the number of the LED elements connected in series in the each light-emitting portion, whether the fixed resistor is connected to the each light-emitting portion, and the resistance of the fixed resistor connected to the each light-emitting portion.

2. The light-emitting device according to claim 1, wherein each of the light-emitting portions connected to corresponding one of the three or more wires is arranged such that light emitted from any of the light-emitting portions is able to be mixed with light emitted from the rest of the light-emitting portions, a color temperature of light emitted from the first light-emitting portion is lower than a color temperature of light emitted from the second light-emitting portion and the color temperature of the light emitted from the second light-emitting portion is lower than a color temperature of light emitted from the third light-emitting portion, and a color temperature of a mixed color emitted from each of the light-emitting portions changes with a curve along a locus of a blackbody radiation.

3. The light-emitting, device according to claim 1, wherein each of the light-emitting portions includes at least two kinds of phosphors, and contents of the phosphors included in the light-emitting portions are all different from each other.

4. The light-emitting device according to claim 1, wherein one or more light-emitting portions are connected in series to each of the three or more wires.

5. The light-emitting device according to claim 1, further comprising a resin dam provided surrounding the whole of the light-emitting portion.

* * * * *